United States Patent
Minotani et al.

(10) Patent No.: US 11,936,396 B2
(45) Date of Patent: Mar. 19, 2024

(54) AD CONVERTER WITH SELF-CALIBRATION FUNCTION

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 152 days.

(21) Appl. No.: 17/770,770

(22) PCT Filed: Oct. 30, 2019

(86) PCT No.: PCT/JP2019/042542
§ 371 (c)(1),
(2) Date: Apr. 21, 2022

(87) PCT Pub. No.: WO2021/084645
PCT Pub. Date: May 6, 2021

(65) Prior Publication Data
US 2022/0393696 A1    Dec. 8, 2022

(51) Int. Cl.
*H03M 1/10*    (2006.01)
(52) U.S. Cl.
CPC ............................... *H03M 1/1014* (2013.01)
(58) Field of Classification Search
CPC .... H03M 1/1014; H03M 1/1028; H03M 1/54; G01R 19/00; G01R 19/257; G01R 35/00
USPC .................................................. 341/155, 120
See application file for complete search history.

(56) References Cited

U.S. PATENT DOCUMENTS

| 5,027,116 | A  | * | 6/1991  | Armstrong | .......... | H03M 1/1028 |
|           |    |   |         |           |            | 341/120     |
| 7,825,837 | B1 | * | 11/2010 | Khasnis   | ..............| H03M 1/1023 |
|           |    |   |         |           |            | 341/120     |
| 9,356,615 | B1 | * | 5/2016  | Ranjbar   | ..............| H03M 1/1023 |
| 2013/0088375 | A1 | * | 4/2013 | Wu       | .....................| H03M 1/1052 |
|           |    |   |         |           |            | 341/120     |

OTHER PUBLICATIONS

MEMEs Support page, *Overview and Mechanism of A / D Conversio*, MEMEs Support Page-Play with MEMEs!, Sep. 10, 2018 (reading day), http://memes.sakura.ne.ip/memes/?page_id=1120, pp. 1-6.

(Continued)

*Primary Examiner* — Jean B Jeanglaude
(74) *Attorney, Agent, or Firm* — Workman Nydegger

(57) ABSTRACT

An AD converter with self-calibration function that does not require an instrument for calibration, and includes: a reference voltage unit that generates a reference voltage; a summation and conversion unit that has two or more unit voltages serving as units of amount of change in a summed voltage, and during conversion, sums up any one unit voltage of the two or more unit voltages until the summed voltage exceeds the reference voltage, with an input voltage being an initial value of the summed voltage; and a control unit including a calibration control section that calibrates the two or more unit voltages and an offset voltage of a comparator at a time of calibration, and a conversion control section that determines a polarity of the offset voltage of the comparator and thereafter converts the input voltage to a digital value during conversion.

8 Claims, 16 Drawing Sheets

(56) References Cited

OTHER PUBLICATIONS

Rahul Prakash et al., *Trimming to Improve DAC Accuracy* (1/3), EDN Japan, Nov. 10, 2016, http://ednjapn.com/edn/articles/1611/08/news012.html, pp. 1-11.

Macnica, Inc., *Back Trick! Realize a Pseudo D/A Converter Using PWM*, Macnica Online Service, Apr. 21, 2015, https://service.macnica.co.jp/library/107577, 1-2.

* cited by examiner

Fig. 2(a) WHEN POSITIVE CURRENT SOURCE IS CONNECTED
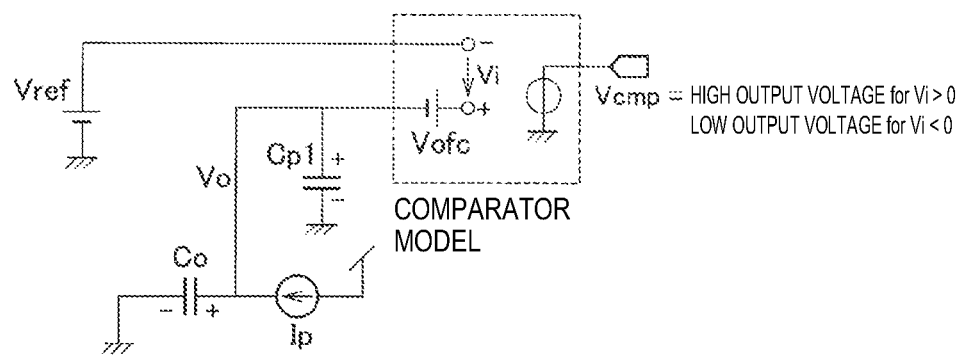
Fig. 2(b) WHEN NEGATIVE CURRENT SOURCE IS CONNECTED
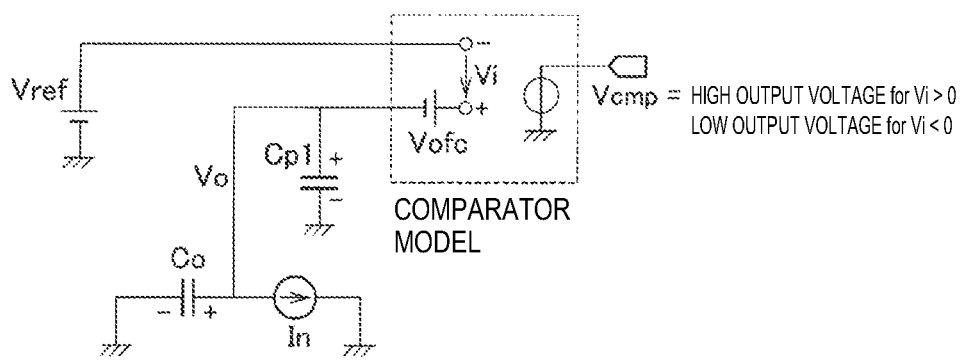

Fig. 8 (a) WHEN SW3 IS CONNECTED
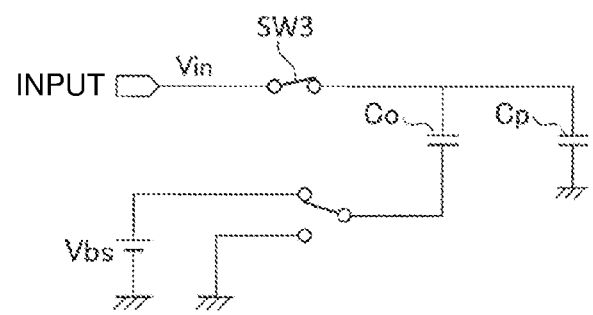
Fig. 8 (b) WHEN SW3 IS DISCONNECTED
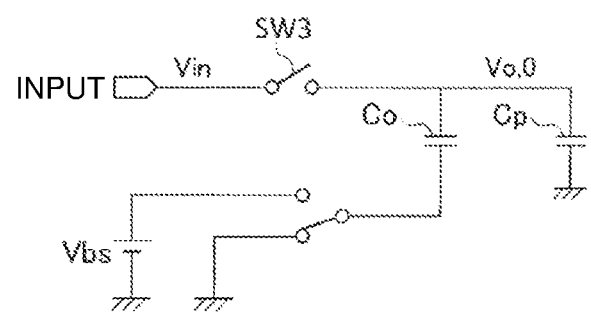

Fig. 9(a) WHEN SW3 IS CONNECTED
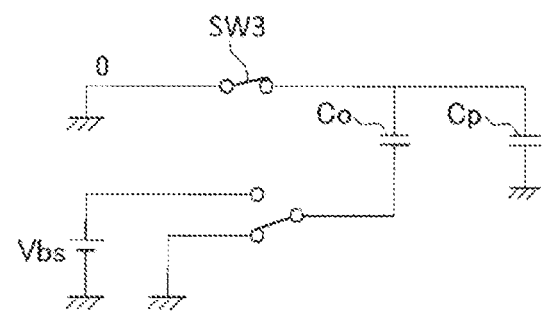
Fig. 9(b) WHEN SW3 IS DISCONNECTED
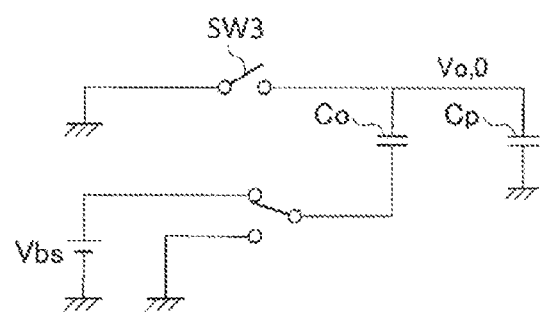

Fig. 15(a) SUMMED VOLTAGE
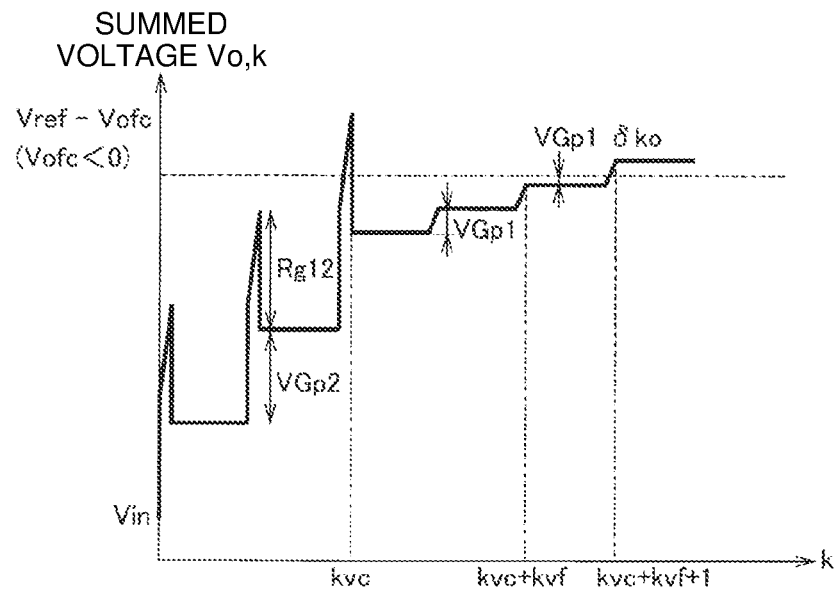
Fig. 15(b) CURRENT VALUE
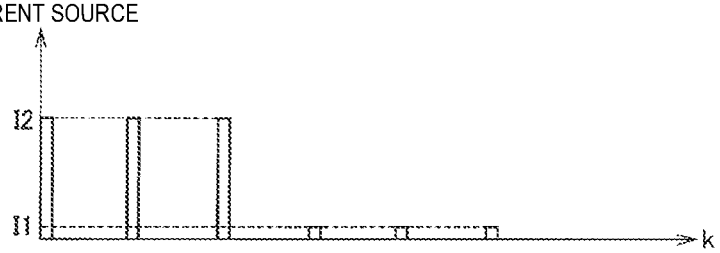

AD CONVERTER WITH SELF-CALIBRATION FUNCTION

TECHNICAL FIELD

The present invention relates to an AD converter with self-calibration function that does not require an instrument for calibration.

BACKGROUND ART

An AD converter, as is well known, is formed from a DA converter configured to output a known voltage and a comparator. Such an AD converter sequentially varies an output value of the DA converter and uses a digital value that results when setting the smallest output value of the DA converter that causes an output of the comparator to change from a low output voltage to a high output voltage as a conversion value of the AD converter (Non-Patent Literature 1). Variations associated with change in offset or linearity of the DA converter over time leads to change of the AD converter over time.

Representative DA converters include R-2R ladder circuits, resistor string circuits (Non-Patent Literature 2), and PWM circuits (Non-Patent Literature 3). With an R-2R ladder circuit, a variable signal source with high resolution and high accuracy can be constructed with a relatively small number of resistive elements. However, resistances with high accuracy are required on MSB side in order to increase the accuracy of output with respect to a setting code.

A resistor string circuit consumes less power and has high monotone increasing property, but requires trial and error in layout design and production because the linearity of output with respect to a setting code depends on the uniformity and layout of resistive elements.

A PWM circuit has an advantage of stable performance because it does not require a resistive element array like ones in R-2R ladder circuits and resistor string circuits, and can be manufactured only with digital circuits; however, it requires design and production with high frequency accuracy for a high-order low-pass filter that serves to remove ripple noise occurring in the output.

For an R-2R ladder circuit and a resistor string circuit, linearity and accuracy can be improved through adjustment to resistive elements and/or correction of relationship between setting codes and the output in the final stage of production. Doing so, however, requires a reference instrument outside the circuit because adjustment and/or correction is made while checking the output of the R-2R ladder circuit or the resistor string circuit.

Further, an offset voltage of the comparator and a unit voltage of the DA converter and its linearity change with time. Thus, regular calibration is essential to maintain conversion accuracy over a long term (Non-Patent Literature 2).

CITATION LIST

Non-Patent Literature

Non-Patent Literature 1: Outline and mechanism of A/D conversion, support page for MEMEs [searched on May 16, 2019], the Internet (URL: http://memes.sakura.ne.jp/memes/?page_id=1120)

Non-Patent Literature 2: Trimming for improving the accuracy of DAC (1/3), EDN Japan [searched on May 16, 2019], the Internet (URL: http://ednjapn.com/edn/articles/1611/08/news012.html)

Non-Patent Literature 3: A trick to create pseudo-D/A converter using PWM! [searched on May 16, 2019], the Internet (https://service.macnica.co.jp/library/107577)

SUMMARY OF THE INVENTION

Technical Problem

However, for making adjustment to the offset voltage of the comparator and the unit voltage of the DA converter, it is necessary to have a reference instrument outside the AD converter. For example, for calibrating an AD converter installed at a remote location, one has to carry an instrument. There is accordingly a challenge of being difficult to calibrate multiple AD converters present at remote locations.

In view of this challenge, an object of the present invention is to provide an AD converter with self-calibration function that does not require an instrument for calibration.

Means for Solving the Problem

An AD converter with self-calibration function according to an aspect of the present invention is an AD converter with self-calibration function that does not require an instrument for calibration, and includes: a reference voltage unit that generates a reference voltage; a summation and conversion unit that has two or more unit voltages serving as units of amount of change in a summed voltage, and during conversion, sums up any one of the two or more unit voltages until the summed voltage exceeds the reference voltage, with an input voltage being an initial value of the summed voltage; and a control unit including a calibration control section that calibrates the two or more unit voltages and an offset voltage of a comparator at a time of calibration, and a conversion control section that determines a polarity of the offset voltage of the comparator and thereafter converts the input voltage to a digital value during conversion.

Effects of the Invention

The present invention can provide an AD converter with self-calibration function that does not require an external instrument for calibration.

BRIEF DESCRIPTION OF DRAWINGS

FIGS. 2(a) and 2(b) show an equivalent circuit of the summation section shown in FIG. 1.

FIGS. 8(a) and 8(b) show an equivalent circuit of the difference computation portion shown in FIG. 7 during conversion.

FIGS. 9(a) and 9(b) shows an equivalent circuit of the difference computation portion shown in FIG. 7 during calibration.

FIGS. 15(a) and 15(b) schematically shows an example of relationship between a summed voltage generated by the summation section shown in FIG. 13 and summation count.

DESCRIPTION OF EMBODIMENTS

Figure 1:
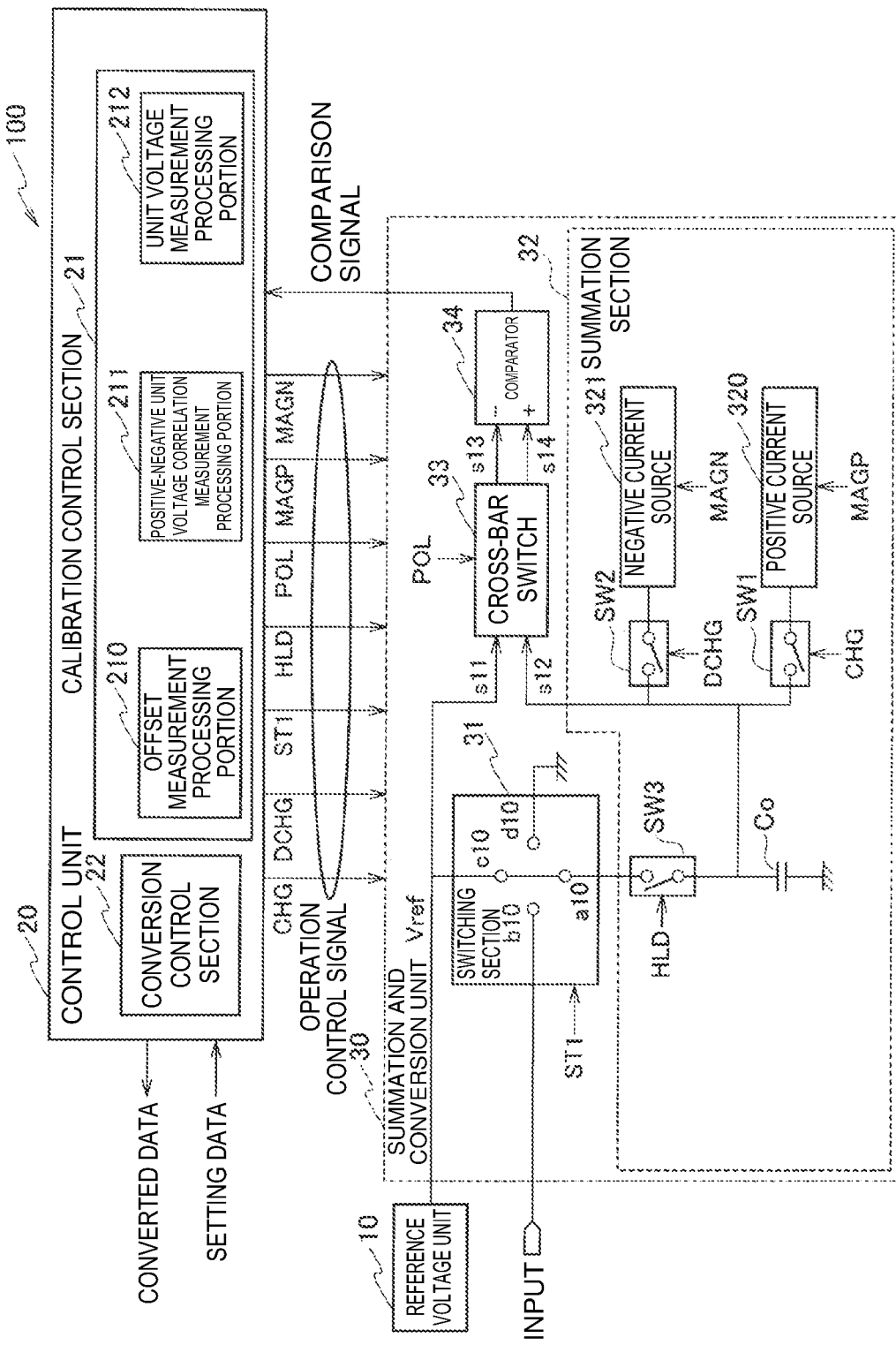
FIG. 1 is a functional block diagram showing an exemplary configuration of an AD converter with self-calibration function according to a first embodiment of the present invention.

Embodiments of the present invention are now described with reference to the drawings. Throughout the multiple drawings, the same components are denoted with the same reference numerals and their descriptions are not repeated.

First Embodiment

FIG. 1 is a block diagram showing an exemplary configuration of an AD converter with self-calibration function according to a first embodiment of the present invention. An AD converter with self-calibration function 100 (hereinafter an AD converter) shown in FIG. 1 is an AD converter with self-calibration function that does not require an instrument for calibration.

The AD converter 100 includes a reference voltage unit 10, a control unit 20, and a summation and conversion unit 30. The summation and conversion unit 30 includes a switching section 31, a summation section 32, and a comparator 34.

The summation and conversion unit 30 sums up a unit voltage in the summation section 32 with an input voltage being an initial value, compares a generated summed voltage with a reference voltage Vref via the comparator 34, and converts the input voltage to a digital value. The summation and conversion unit 30 has at least two kinds of unit voltages serving as units of amount of change in the summed voltage, and calibrates at least two units of summation and an offset voltage of the comparator 34 at the time of calibration. The summation section 32 is formed from current sources and a capacitance Co, where a positive current source 320 is used for increasing the summed voltage and a negative current source 321 is used for decreasing the summed voltage.

Due to variations in characteristics of circuit elements forming the comparator 34, the offset voltage of the comparator 34 can vary depending on the input voltage of the comparator 34. Accordingly, a processing method that performs AD conversion by holding the input voltage and comparing the input voltage being held with the summed voltage of the summation section 32 via the comparator 34 would require a calibration process that takes into account a possible change in the offset voltage of the comparator 34 associated with the magnitude of the input voltage, and is expected to involve a large number of calibration processes. In addition, an ideal operation of a current source, which feeds a constant current irrespective of the voltage of an output terminal to which current is fed, is not achieved with an actual current source and the voltage of the output terminal of the current source that makes the current constant is limited. Thus, a voltage range of the summation section 32 is also limited due to this characteristic of the current source. This in turn limits an input voltage range of the AD converter. In general, where a current source is made of a transistor, a positive current source that outputs a current toward a ground deviates from an ideal operation when the voltage at the output terminal of the current source is higher than a voltage that is lower than a supply voltage by a threshold voltage of the transistor. A negative current source, which draws current from a high potential, deviates from an ideal operation when the voltage at the output terminal of the current source is between the threshold voltage of the transistor and the ground.

This embodiment achieves processing that requires only the offset voltage of the comparator 34 at the reference voltage Vref to be calibrated, by comparing the summed voltage that results from summation of a unit voltage at the summation section 32 with the input voltage being the initial value to the reference voltage Vref, which is constant regardless of the magnitude of the input voltage. The AD converter 100 also performs AD conversion processing after performing summation until the summed voltage is at the reference voltage Vref, using the positive current source 320 when the input voltage is smaller than the reference voltage Vref and the negative current source 321 when the input voltage is greater than the reference voltage Vref. This processing can make the input voltage range from the supply voltage to the ground without depending on limitation on the voltage at the output terminal of the current source.

Although two voltages are shown as examples of unit voltages, i.e., a positive unit voltage generated with the positive current source 320 and a negative unit voltage generated with the negative current source 321, the number of unit voltages may be a plural number higher than two.

The AD converter 100 of this embodiment is an AD converter that does not require an instrument for calibration, and includes: a reference voltage unit 10 that generates a reference voltage Vref; a summation and conversion unit 30 that has two or more unit voltages serving as units of amount of change in a summed voltage, and during conversion, sums up any one of the two or more unit voltages until the summed voltage exceeds the reference voltage Vref, with an input voltage being an initial value of the summed voltage; and a control unit 20 including a calibration control section 21 that calibrates the two or more unit voltages and an offset voltage of a comparator 34 at a time of calibration, and a conversion control section 22 that determines a polarity of the offset voltage of the comparator 34 and thereafter converts the input voltage to a digital value during conversion.

The summation and conversion unit 30 includes: a switching section 31 that connects, to a capacitance Co holding the unit voltage, the input voltage during conversion and either the reference voltage Vref or a ground voltage at the time of calibration; a summation section 32 that, during conversion, makes the input voltage be held in the capacitance Co and thereafter sums any one of the two or more unit voltages to the voltage being held to generate a summed voltage, and at the time of calibration, makes the reference voltage Vref or the ground voltage be held in the capacitance Co and thereafter sums any one of the two or more unit voltages to the voltage being held to generate a summed voltage; a cross-bar switch 33 that switches between a case where the reference voltage Vref is output to one output end and the summed voltage is output to another output end, and a case where the reference voltage Vref is output to the other output end and the summed voltage is output to the one output end; and a comparator 34 that outputs a comparison signal when a voltage at a positive input end exceeds a voltage at a negative input end while the one output end being connected with the negative input end and the other output end being connected with the positive input end.

The summation section 32 includes the capacitance Co that produces a summed voltage with a charge accumulated therein, the positive current source 320 that is used for increasing the summed voltage when the input voltage is lower than the reference voltage Vref, the negative current source 321 that is used for decreasing the summed voltage when the input voltage is higher than the reference voltage Vref, a SW1 that connects and disconnects the capacitance Co and the positive current source 320, a SW2 that connects and disconnects the capacitance Co and the negative current source, and a SW3 that is connected when an initial value is given to the capacitance Co.

The switching section 31, the cross-bar switch 33, the SW1, the SW2 and the SW3 are controlled in response to operation control signals from the control unit 20.

Summation operations in this embodiment are now described. Summation is carried out by supplying (or removing) a charge to/from the capacitance Co from the positive current source 320 (or the negative current source 321) for an amount of time equal to an integer multiple of a predetermined unit of time. FIG. 2(a) shows an equivalent circuit model where s11 and s13 as well as s12 and s14 of the cross-bar switch are connected and the positive current source 320 and the capacitance Co are connected to each other. In this equivalent circuit, an electrode connected to a current source side of the capacitance Co represents plus (+) and a ground side represents minus (−). The offset voltage of the comparator 34 is indicated as Vofc. In summation with the positive current source 320, the following is repeated: the SW1 is placed in a connected state for a predetermined time Δt with the SW2 and the SW3 in a disconnected state and then the SW1 is placed in a disconnected state. A charge that is supplied from the positive current source 320 when this is repeated kp times is Ip kp Δt. Considering a parasitic capacitance Cp1 present at the positive input side of the comparator 34, the summed voltage is represented by:

Math. 1

$$Vo = \frac{Ip}{Co + Cp1} \Delta t k p \quad (1)$$

In summation with negative current source 321, the following is repeated: the SW2 is placed in a connected state for the predetermined time Δt with the SW1 and the SW3 in a disconnected state and thereafter the SW2 is placed in a disconnected state. FIG. 2(b) shows an equivalent circuit when s11 and s13 as well as s12 and s14 of the cross-bar switch 33 are connected and the negative current source 321 and the capacitance Co are connected with each other. Upon repeating placement the SW2 in a connected state kn times, a charge of In knΔt (In>0) is removed by the negative current source 321 from a charge (Co+Cp1)Vo,0 prior to connection of the negative current source 321 with the capacitance Co, so the summed voltage is represented by:

Math. 2

$$Vo = Vo, 0 - \frac{In}{Co + Cp1} \Delta t k n \quad (2)$$

Therefore, if the unit voltage Δt Ip/(Co+Cp1) when the positive current source 320 is connected and the unit voltage Δt In/(Co+Cp1) when the negative current source 321 is connected are known, the summed voltage can be calculated from the number of times kp the positive current source 320 is connected and the number of times kn the negative current source 321 is connected. In this embodiment, with Ip>In, the unit voltage when the positive current source 320 is connected will be referred to as a positive unit voltage and that when the negative current source is connected will be referred to as a negative unit voltage. In the following description, the offset voltage of the comparator is described as being negative (Vofc<0).

Figure 3:
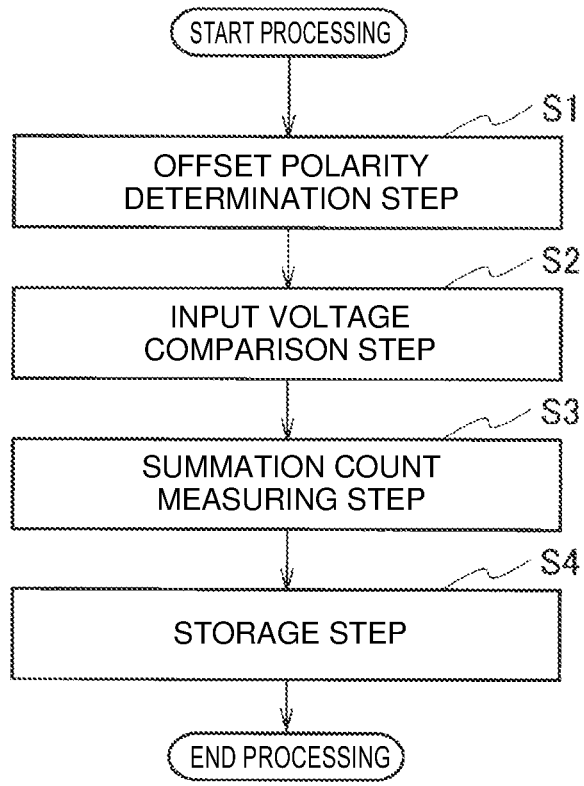
FIG. 3 is a flowchart illustrating a processing procedure of the conversion control section shown in FIG. 1.

During conversion in this embodiment, conversion control processing is executed by the conversion control section 22. A processing flow of the conversion control section is shown in FIG. 3. In an offset polarity determination step S1, a comparison signal is monitored at the control unit 20 with a10 and c10 of the switching section 31 connected and the SW3 connected, and connection of the cross-bar switch 33 is determined. When the comparison signal is at a low-potential voltage, s11 and s13 as well as s12 and s14 of the cross-bar switch 33 are connected, and when the comparison signal is at a high-potential voltage, the s11 and s14 as well as s12 and s13 of the cross-bar switch 33 are connected.

In an input voltage comparison step S2, the input voltage is compared to the reference voltage Vref with a10 and b10 of the switching section 31 connected and the SW3 connected. In a summation count measuring step S3, use of either the positive current source 320 or the negative current source 321 is determined based on a result of comparison in the input voltage comparison step S2, after which the SW3 is disconnected and a change of state in the comparison signal is monitored, thereby measuring a conversion summation count kv that was required until the summed voltage became equal to the reference voltage Vref. In a storage step S4, the conversion summation count kv is stored.

During calibration, the calibration control section 21 included in the control unit 20 operates. The calibration control section 21 includes: an offset measurement processing portion 210 that measures a summation count of the unit voltage that is required until an output of the comparator 34 is inverted after the capacitance Co is precharged with a unit voltage equivalent to the reference voltage Vref; a positive-negative unit voltage correlation measurement processing portion 211 that measures a positive-negative correlation summation count if the input voltage is greater than the reference voltage Vref, the positive-negative correlation summation count being a number of summations that is required until the output of the comparator 34 is inverted as a result of adding a positive unit voltage by an over-summation count equal to the summation count plus a predetermined number of times to generate a summed voltage and thereafter subtracting a negative unit voltage from the summed voltage until the summed voltage becomes smaller than the reference voltage Vref; and a unit voltage measurement processing portion 212 that measures a unit voltage summation count after the unit voltage is reset, the unit voltage summation count being a number of summations of the unit voltage that is required until the output of the comparator 34 is inverted as a result of summation of the positive unit voltage. Note that, connection of the cross-bar switch 33 during calibration is maintained in a connection state determined by the conversion control section 22.

Figure 4:
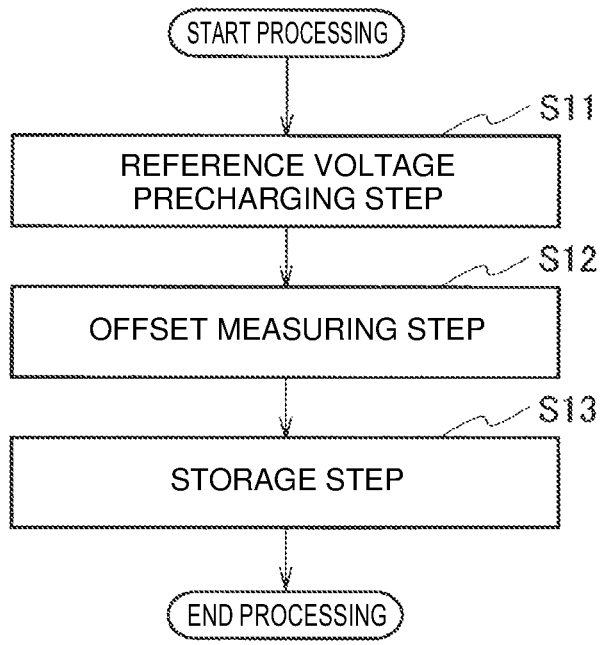
FIG. 4 is a flowchart illustrating a processing procedure of the offset measurement processing portion shown in FIG. 1.

FIG. 4 shows a processing flow of the offset measurement processing portion. In a reference voltage precharging step S11, the SW3 is connected and disconnected while a10 and c10 of the switching section 31 being connected so as to precharge the capacitance Co with a charge equivalent to the reference voltage Vref. In an offset measuring step S12, summation is performed until the summed voltage exceeds the reference voltage by monitoring the change of state in the comparison signal, and an offset summation count ko, which is a number of summations that is one less than the number of summations at which the reference voltage is exceeded for the first time, is measured. In a storage step S13, ko is stored. For the summed voltage and the reference voltage Vref, the equation below holds, where VGp is the positive unit voltage when the positive current source 320 is used, Vofc is the offset voltage of the comparator 34, and Vref is the reference voltage:

Math. 3

$$\text{Vref} - \text{Vofc} = \text{VGp}(ko + \delta ko) + \text{Vref} \quad (3)$$

VGp$\delta$ko on the right side of Expression (3) represents the difference between the sum of the reference voltage Vref and the offset voltage, and the summed voltage immediately before a change of state in the comparison signal, where $\delta$ko is a real number equal to or greater than 0 and less than 1.

Figure 5:
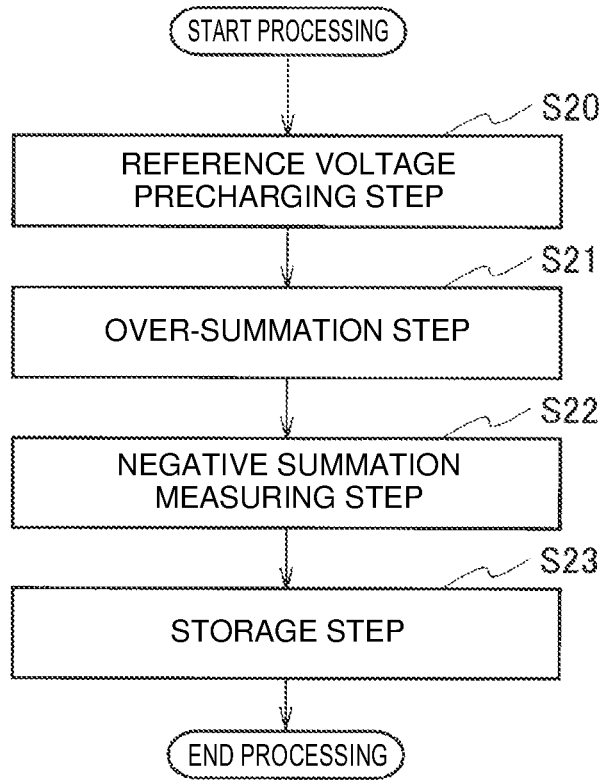
FIG. 5 is a flowchart illustrating a processing procedure of the positive-negative unit voltage correlation measurement processing portion shown in FIG. 1.

Positive-negative unit voltage correlation measurement processing is performed when the input voltage is greater than the reference voltage. FIG. 5 shows a processing flow of a positive-negative unit voltage correlation measurement processing portion. After the capacitance Co is precharged with a charge equivalent to the reference voltage Vref in a reference voltage Vref precharging step S20, an over-summation step S21 is performed to sum up the unit voltage a number of times equal to the offset summation count ko plus a predetermined summation count ke. Then, in a negative summation measuring step S22, summation is performed with a negative unit voltage VGn until the summed voltage is smaller than the reference voltage Vref by monitoring the change of state in the comparison signal. Through this processing, a positive-negative correlation summation count kp, which is a number of summations that is one less than the number of summations at which the summed voltage becomes smaller than the reference voltage Vref for the first time, is measured in the negative summation measuring step S22. In a storage step S23, kp is stored. In the positive-negative unit voltage correlation measurement processing, the equation below holds for the summed voltage and the reference voltage:

Math. 4

$$\text{Vref} - \text{Vofc} = \text{VGp}(ko + ke) - \text{VGn}(kp + \delta kp) + \text{Vref} \quad (4)$$

VGn$\delta$kp on the right side of Expression (4) represents the difference between the sum of the reference voltage Vref and the offset voltage, and the summed voltage immediately before a change of state in the comparison signal, where $\delta$kp is a real number equal to or greater than 0 and less than 1.

Figure 6:
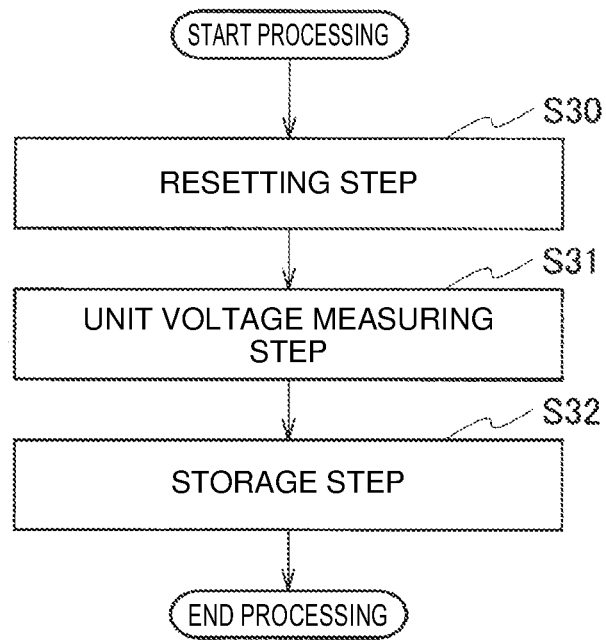
FIG. 6 is a flowchart illustrating a processing procedure of the unit voltage measurement processing portion shown in FIG. 1.

FIG. 6 shows a processing flow of the unit voltage measurement processing portion. In a resetting step S30, an accumulated charge of the capacitance Co is reset. After that, in a unit voltage measuring step S31, summation is performed with the positive unit voltage until the summed voltage exceeds the reference voltage Vref by monitoring the change of state in the comparison signal. Through this processing, a unit voltage summation count ki, which is a number of summations that is one less than the number of summations at which the summed voltage becomes greater than the reference voltage for the first time, is measured. In a storage step S32, ko is stored. In the unit voltage measurement processing, the equation below holds for the summed voltage, and the reference voltage:

Math. 5

$$\text{Vref} - \text{Vofc} = \text{VGp}(ki + \delta ki) \quad (5)$$

VGp$\delta$ki on the right side of Expression (5) represents the difference between the sum of the reference voltage Vref and the offset voltage and the summed voltage immediately before a change of state in the comparison signal, where $\delta$ki is a real number equal to or greater than 0 and less than 1.

For facilitating analysis, ko+$\delta$ko=Ko, kp+$\delta$kp=Kp, and ki+$\delta$ki=Ki are assumed and the expression of VGp below is obtained by determining the difference between Expression (3) and Expression (5):

Math. 6

$$VGpKo + Vref = VGpKi \quad (6)$$
$$VGp = \frac{Vref}{Ki - Ko}$$

Substituting Expression (6) into Expression (3) gives the expression of Vofc below:

Math. 7

$$Vofc = \frac{Ko}{Ki - Ko} Vref \quad (7)$$

Further, an expression of VGn is obtained from Expression (3) and Expression (4):

Math. 8

$$VGpKo = VGp(ko + ke) - VGnKp \quad (8)$$
$$VGn = \frac{ko + ke - Ko}{Kp(Ki - Ko)} Vref$$

$\delta$ki, $\delta$kp, $\delta$ko contained in VGp, VGn, Vofc are real numbers equal to or greater than 0 and less than 1, but their specific values are unknown. Due to this uncertainty of $\delta$ki, $\delta$kp, $\delta$ko, possible values of VGp, VGn, Vofc have ranges.

Calibration values for VGp, VGn, Vofc are determined from medians of the respective ranges of VGp, VGn, Vofc. Partial differential of Expression (6) with δki and δko gives:

Math. 9

$$\frac{\partial VGp}{\partial(\delta ki)} = -\frac{Vref}{(Ki-Ko)^2} < 0 \qquad (9)$$

$$\frac{\partial VGp}{\partial(\delta ko)} = -\frac{Vref}{(Ki-Ko)^2} > 0 \qquad (10)$$

From Expression (9) and Expression (10), VGp is monotone decreasing for δki and monotone increasing for δko. Accordingly, the range of VGp is represented by:

Math. 10

$$\frac{Vref}{ki-ko+1} < VGp < \frac{Vref}{ki-ko-1} \qquad (11)$$

From Expression (11), a calibration value VGpc, which is the median of VGp, is obtained as:

Math. 11

$$VGpc = \frac{Vref}{2}\left\{\frac{1}{ki-ko+1} + \frac{1}{ki-ko-1}\right\} \qquad (12)$$

Partial differential of Expression (7) with δki and δko gives:

Math. 12

$$\frac{\partial Vofc}{\partial(\delta ki)} = -\frac{KoVref}{(Ki-Ko)^2} < 0 \qquad (13)$$

$$\frac{\partial Vofc}{\partial(\delta ko)} = \frac{1}{Ki-Ko}Vref + \frac{KoVref}{(Ki-Ko)^2} = \frac{KiVref}{(Ki-Ko)^2} > 0 \qquad (14)$$

From Expression (13) and Expression (14), Vofc is monotone decreasing for δki and monotone increasing for δko. Accordingly, the range of Vofc is represented by:

Math. 13

$$\frac{koVref}{ki-ko+1} < VGp < \frac{(ko+1)Vref}{ki-ko-1} \qquad (15)$$

From Expression (15), a calibration value Vofcc, which is the median of Vofc, is obtained as:

Math. 14

$$Vofcc = \frac{Vref}{2}\left\{\frac{ko}{ki-ko+1} + \frac{ko+1}{ki-ko-1}\right\} \qquad (16)$$

Partial differential of Expression (8) with δki, δkp, and δko gives:

Math. 15

$$\frac{\partial VGn}{\partial(\delta ki)} = -\frac{(ko+ke-Ko)Vref}{Kp(Ki-Ko)^2} < 0 \qquad (17)$$

$$\frac{\partial VGp}{\partial(\delta ko)} = \qquad (18)$$

$$\frac{-Vref}{Kp(Ki-Ko)} + \frac{(ko+ke-Ko)Vref}{Kp(Ki-Ko)^2} = \frac{(-Ki+ko+ke)Vref}{Kp(Ki-Ko)^2} < 0$$

$$\frac{\partial VGn}{\partial(\delta kp)} = -\frac{(ko+ke-Ko)Vref}{(Ki-Ko)Kp^2} < 0 \qquad (19)$$

From Expressions (17), (18) and (19), VGn is monotone decreasing for δki, δkp, and δko. Accordingly, the range of VGn is represented by:

Math. 16

$$\frac{ke-1}{(kp+1)(ki-ko)}Vref < VGn < \frac{ke}{kp(ki-ko)}Vref \qquad (20)$$

From Expression (20), a calibration value VGnc, which is the median of VGn, is obtained as:

Math. 17

$$VGnc = \frac{Vref}{2}\left\{\frac{ke-1}{(kp+1)(ki-ko)} + \frac{ke}{kp(ki-ko)}\right\} \qquad (21)$$

As shown in the foregoing description, VGpc, VGnc, Vofcc as the calibration values for the unit voltages VGp, VGn and the offset voltage Vofc of the comparator 34 can be obtained through the offset measurement processing, the positive-negative unit voltage correlation measurement processing, and the unit voltage measurement processing in calibration status.

From the processing flow of the conversion control section 22 shown in FIG. 3, a relationship between Vin and the conversion summation count kv when an input voltage Vin is Vref−Vofc>Vin is represented by:

Math. 18

$$Vref-Vofcc=VGpc(kv+\delta kv)+Vin \qquad (22)$$

In Expression (22), VGpδkv represents the difference between the sum of the reference voltage Vref and the offset voltage, and the summed voltage immediately before a change of state in the comparison signal, where δkv is a real number equal to or greater than 0 and less than 1. Due to this uncertainty of δkv, a possible value of Vin has a range. A converted value of Vin is determined by the median of the range of Vin. The range of Vin is indicated by Expression (23), and a converted value Vinc of Vin is represented by Expression (24):

Math. 19

$$Vref-Vofcc-VGpc(kv+1)<Vin<Vref-Vofcc-VGpc\;kv \qquad (23)$$

$$Vinc=Vref-Vofcc-VGpc(kv+0.5) \qquad (24)$$

The relationship between Vin and the conversion summation count kv when the input voltage Vin is Vref−Vofc<Vin is represented by:

Math. 20

$$Vref-Vofcc=-VGnc(kv+\delta kv)+Vin \qquad (25)$$

In Expression (25), VGncδkv represents the difference between the sum of the reference voltage Vref and the offset voltage, and the summed voltage immediately before a change of state in the comparison signal, where δkv is a real number equal to or greater than 0 and less than 1. Due to this uncertainty of δkv, a possible value of Vin has a range. A converted value of Vin is determined by the median of the range of Vin. The range of Vin is indicated by Expression (26) and the converted value Vinc of Vin is represented by Expression (27):

Math. 21

$$Vref-Vofcc+VGnc\ kv<Vin<Vref-Vofcc+VGnc(kv+1) \qquad (26)$$

$$Vinc=Vref-Vofcc+VGnc(kv+0.5) \qquad (27)$$

With the processing by the conversion control section 22 shown in FIG. 3, the converted value Vinc of the input voltage can be obtained using the calibration values VGpc, VGnc, Vofcc acquired in calibration status.

While the foregoing description is for the case of Vofc<0, when Vofc>0, 11 and s14 as well as s12 and s13 of the cross-bar switch 33 are connected by the conversion control section 22. This connection will result in comparison of the sum of the reference voltage Vref and the offset voltage with the summed voltage at the input of the comparator 34; thus, a calibrated converted value Vinc can be obtained during conversion and calibration as in the above description also when Vofc>0.

The embodiment described above enables calibration of the offset of the comparator 34 and the summation section 32 as an analog value output unit of the DA converter even if the offset of the comparator 34, the capacitance Co defining the unit of summation, and the like vary due to change over time, so that an AD converter 100 having high long-term stability can be provided.

(First Variation)

Figure 7:
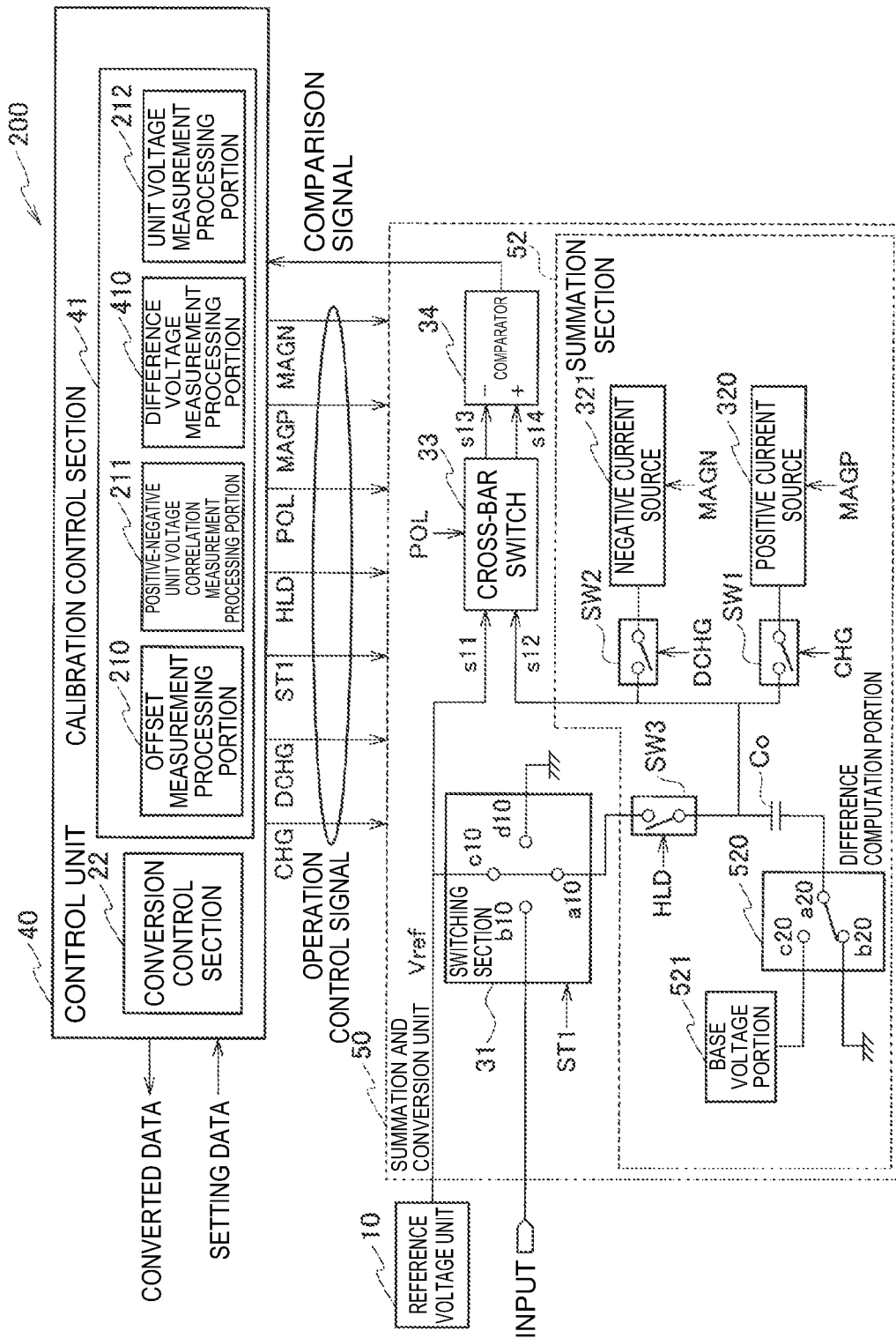
FIG. 7 is a functional block diagram showing an exemplary configuration of an AD converter with self-calibration function with a modification to the summation section shown in FIG. 1.

FIG. 7 shows a functional block diagram of an AD converter 200 with a modification to the summation section 32 in the first embodiment. The AD converter 200 in the first variation shown in FIG. 7 is different from the AD converter 100 in that it includes a summation section 52 and a configuration control section 41.

The summation section 52 can make the input voltage range from the supply voltage to the ground through processing that holds the difference between the input voltage and a base voltage as an initial value when the input voltage is greater than the reference voltage Vref. The summation section 52 includes the capacitance Co that produces a summed voltage with a charge accumulated therein, a base voltage portion 521 that outputs a base voltage Vbs, a difference computation portion 520 that switches connection when a difference between the input voltage and the base voltage Vbs is held in the capacitance Co, the positive current source 320 used for increasing the summed voltage, the negative current source 321 used for decreasing the summed voltage, the SW1 that connects and disconnects the capacitance Co and the positive current source 320, the SW2 that connects and disconnects the capacitance Co and the negative current source 321, and the SW3 that is connected when an initial value is given to the capacitance Co. The magnitude of a current of the positive current source 320 in the summation section 52 is greater than the magnitude of a current of the negative current source 321, and unit voltages when the positive current source 320 and the negative current source 321 are used will be referred to as a coarse adjustment positive unit voltage and a fine adjustment negative unit voltage, respectively.

FIG. 8 shows an equivalent circuit when the difference between the input voltage Vin and the base voltage Vbs is determined during conversion. Cp represents parasitic capacitance in wiring, the cross-bar switch 33 and the input of the comparator 34. When the input voltage is greater than the reference voltage Vref, a20 and c20 of the difference computation portion 520 are connected upon connection of a10 and b10 of the switching section 31 and connection of the SW3 during conversion. The resulting equivalent circuit is shown in FIG. 8(a). Next, after the SW3 is disconnected, a20 and b20 of the difference computation portion 520 are connected (FIG. 8(b)). Since the charges accumulated in the capacitances Co and Cp in FIGS. 8(a) and 8(b) are preserved, the Expression (28) below holds and a voltage Vo,0 as an initial value before start of summation is represented by Expression (29):

Math. 22

$$CpVin+Co(Vin-Vbs) = CpVo,0+CoVo,0 \qquad (28)$$

$$Vo,0 = Vin - \frac{Co}{Co+Cp}Vbs \qquad (29)$$

By appropriately setting Vbs, Vo,0 can be placed in the voltage range of the output terminal of the positive current source 320 even when the input voltage Vin is outside the voltage range of the output terminal of the positive current source 320. However, since a difference voltage between the actual Vin and Vo,0 is Vbs Co/(Co+Cp) and is unexpectable due to parasitic capacitance, it needs calibration. In this embodiment, Vbs Co/(Co+Cp) is calibrated through the process shown in FIG. 9 at the time of calibration.

In calibration of the difference voltage Vbs Co/(Co+Cp), a10 and d10 of the switching section 31 are connected and the SW3 is connected. Then, the difference computation portion 520 connects a20 and b20 (FIG. 9(a)). Next, after the SW3 is disconnected, a20 and c20 of the difference computation portion 520 are connected (FIG. 9(b)). Since the principle of conservation of charge holds for the charges accumulated in the capacitances Co and Cp between FIGS. 9(a) and 9(b), Expression (30) holds and Vo,0 becomes equal to the difference voltage as represented by Expression (31):

Math. 23

$$Cp0 + Co0 = CpVo,0 + Co(Vo,0 - Vbs) \qquad (30)$$

$$Vo,0 = \frac{Co}{Co+Cp}Vbs \qquad (31)$$

By then measuring the number of summations that is required until the summed voltage becomes equal to the reference voltage Vref, the difference voltage can be calibrated.

Figure 10:
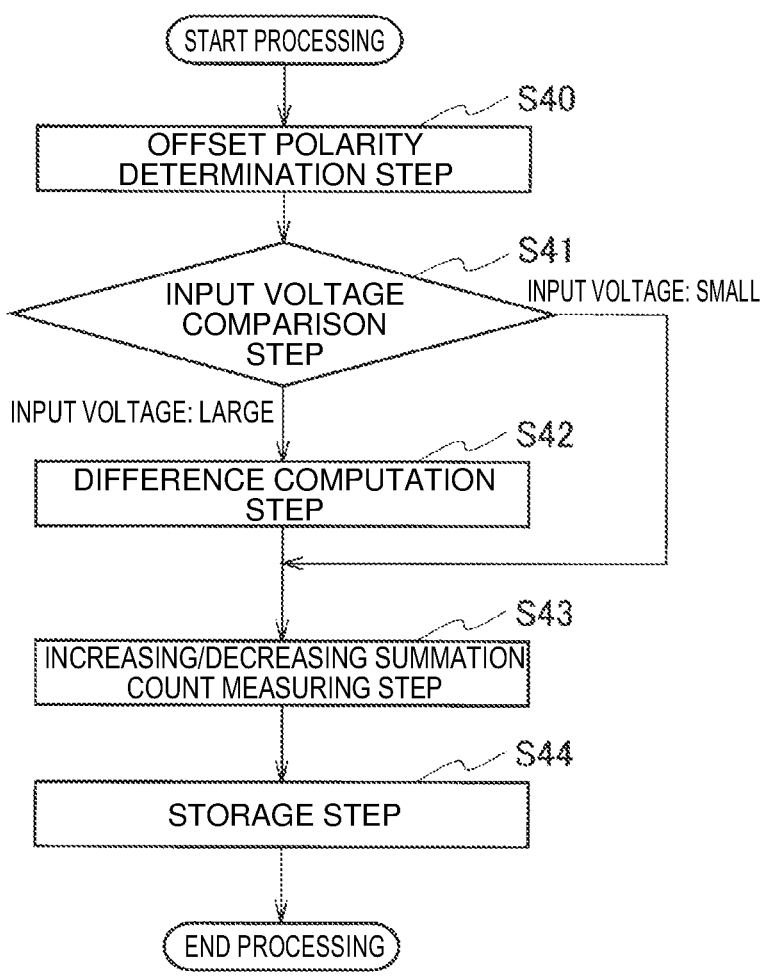
FIG. 10 is a flowchart illustrating a processing procedure of the conversion control section shown in FIG. 7.

FIG. 10 shows a processing flow of the conversion control section 22 which is performed in conversion status at the summation section 52. As an offset polarity determination step S40 and an input voltage comparison step S41 are the same as in the embodiment of FIG. 1, they are not described. If the input voltage is determined as being greater than the reference voltage in the input voltage comparison step S41, a difference computation step S42 is performed. In the difference computation step S42, the process described in FIG. 8 is performed and the initial value of the summation section 52 is set to the input voltage minus the difference voltage. If the input voltage is determined as being smaller than the reference voltage Vref in the input voltage comparison step S41, the input voltage is used as the initial value of the summation section 52.

Figure 11:
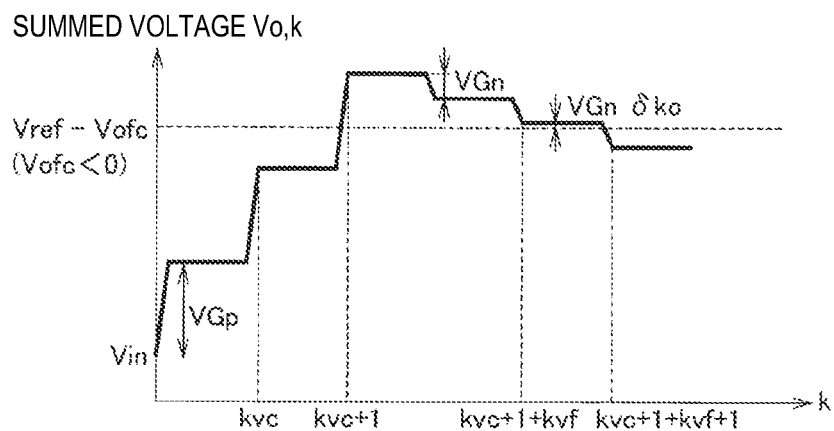
FIG. 11 schematically shows an example of relationship between a summed voltage generated by the summation section shown in FIG. 7 and summation count.

In an increasing/decreasing summation count measuring step S43, summation of the unit voltage is performed first with a coarse adjustment positive unit voltage VGp, and after the summed voltage has exceeded the sum of the reference voltage Vref and the offset voltage of the comparator 34, is performed with a fine adjustment negative unit voltage VGn. FIG. 11 shows a relationship between the summed voltage and the summation count. Given that "the sum of the reference voltage and the offset voltage<the summed voltage" is reached at the kvc+1th summation with the coarse adjustment positive unit voltage, kvc is defined as coarse adjustment summation count. Given that "the sum of the reference voltage Vref and the offset voltage>the summed voltage" is reached at the kvf+1th summation from the start of summation with the fine adjustment negative unit voltage, kvf is defined as fine adjustment summation count. In a storage step S44, kvc and kvf are stored. A relationship between Vin and the coarse adjustment summation count kvc and the fine adjustment summation count kvf when the input voltage Vin is Vref−Vofc>Vin is represented by:
Math. 24

$$\text{Vref}-\text{Vofc}=(\text{kvc}+1)\text{VGp}-(\text{kvf}+\delta\text{kv})\text{VGn}+\text{Vin} \quad (32)$$

In Expression (32), VGnδkv represents the difference between the sum of the reference voltage Vref and the offset voltage, and the summed voltage immediately before a change of state in the comparison signal, where δkv is a real number equal to or greater than 0 and less than 1.

The relationship between Vin and kvc, and kvf when the input voltage Vin is Vref−Vofc<Vin is represented by:
Math. 25

$$\text{Vref}-\text{Vofc}=(\text{kvc}+1)\text{VGp}-(\text{kvf}+\delta\text{kv})\text{VGn}+\text{Vin}-\text{Vs} \quad (33)$$

In calibration, offset measurement processing, positive-negative unit voltage correlation measurement processing, difference voltage measurement processing, and unit voltage measurement processing are performed in the offset measurement processing portion 210, the positive-negative unit voltage correlation measurement processing portion 211, a difference voltage measurement processing portion 410, and the unit voltage measurement processing portion 212, respectively. Connection of the cross-bar switch 33 is maintained in a connection state determined by the conversion control section 22. The offset measurement processing differs from the offset measurement processing in the embodiment of FIG. 1 in that in the offset measuring step of the processing flow in FIG. 4, summation is first performed with the coarse adjustment positive unit voltage, and when the summed voltage exceeds the sum of the reference voltage Vref and the offset voltage of the comparator 34, is performed with the fine adjustment negative unit voltage. Given that "the sum of the reference voltage Vref and the offset voltage<the summed voltage" is reached at the ko2+1th summation with the coarse adjustment positive unit voltage, ko2 is defined as coarse adjustment offset summation count. Given that "the sum of the reference voltage Vref and the offset voltage>the summed voltage" is reached at the ko1+1th summation from the start of summation with the fine adjustment negative unit voltage, ko1 is defined as fine adjustment offset summation count. For the sum of reference voltage Vref and the offset voltage, and the summed voltage, the equation below holds:
Math. 26

$$\text{Vref}-\text{Vofc}=(\text{ko2}+1)\text{VGp}-(\text{ko1}+\delta\text{ko})\text{VGn}+\text{Vref} \quad (34)$$

As the positive-negative unit voltage correlation measurement processing is the same as the processing in the embodiment FIG. 1 except that the summation count measuring step S3 is replaced with the increasing/decreasing summation count measuring step S43, it is not described again. In the embodiment of FIG. 1, the positive-negative unit voltage correlation measurement processing is performed if the input voltage is greater than the reference voltage Vref, whereas it is performed irrespective of the magnitude of the input voltage in the case where the summation section 52 in FIG. 7 is used. A relational expression of the summed voltage and the reference voltage Vref is the expression below, with ko of Expression (4) replaced with ko2:
Math. 27

$$\text{Vref}-\text{Vofc}=(\text{ko2}+\text{ke})\text{VGp}-(\text{kp}+\delta\text{kp})\text{VGn}+\text{Vref} \quad (35)$$

Figure 12:
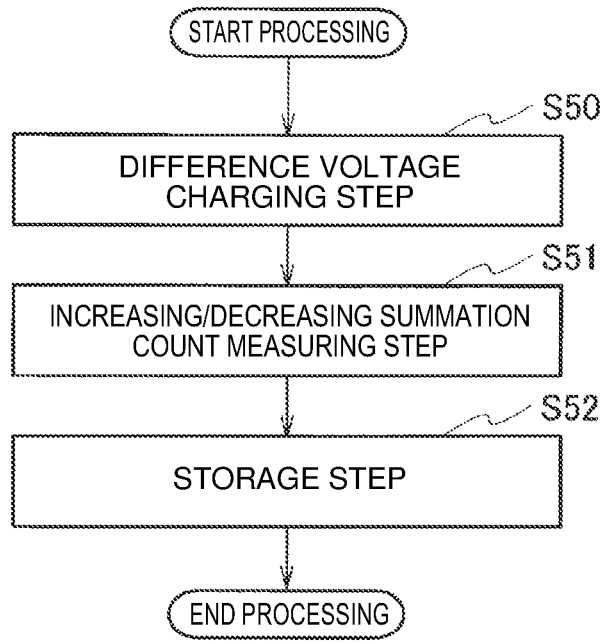
FIG. 12 is a flowchart illustrating a processing procedure of the difference voltage measurement processing portion shown in FIG. 7.

A processing flow of the difference voltage measurement processing portion is shown in FIG. 12. In a difference voltage charging step S50, the process discussed in the description of Expressions (30) and (31) is performed. An increasing/decreasing summation count measuring step S51 is the same as the increasing/decreasing summation count measuring step S43 in the processing flow of the conversion control section 22. Given that "the sum of the reference voltage Vref and the offset voltage<the summed voltage" is reached at the ks2+1th summation with the coarse adjustment positive unit voltage, ks2 is defined as coarse adjustment difference voltage summation count. Given that "the sum of the reference voltage Vref and the offset voltage>the summed voltage" is reached at the ks1+1th summation from the start of summation with the fine adjustment negative unit voltage, ks1 is defined as fine adjustment difference voltage summation count. Expression (36) below holds for the sum of the reference voltage Vref and the offset voltage, a difference voltage Vs and the summed voltage. Here, Vs is equivalent to Expression (31).

Math. 28

$$\text{Vref}-\text{Vofc} = (ks2+1)VGp - (ks1+\delta ks)VGn + Vs \quad (36)$$
$$Vs = \frac{c_o}{c_o+Cp}Vbs$$

In a storage step S52, ks2 and ks1 are stored. The difference voltage measurement processing does not have to be performed when the input voltage is lower than the reference voltage.

The unit voltage measurement processing is the same as the processing in the embodiment of FIG. 1 except that the summation count measuring step is replaced with the increasing/decreasing summation count measuring step. Given that "the sum of the reference voltage Vref and the offset voltage<the summed voltage" is reached at the ki2+1th summation with the coarse adjustment positive unit voltage, ki2 is defined as coarse adjustment unit voltage summation count. Given that "the sum of the reference voltage Vref and the offset voltage>the summed voltage" is reached at the ki1+1th summation from the start of summation with the fine adjustment negative unit voltage, ki1 is defined as fine adjustment unit voltage summation count.

For the sum of the reference voltage Vref and the offset voltage, and the summed voltage, Expression (37) blow holds:

Math. 29

$$\text{Vref} - \text{Vofc} = (ki2+1)VGp - (ki1+\delta ki)VGn \tag{37}$$

To simplify notation, $kvf + \delta kv = Kv$, $ko1 + \delta ko = Ko$, $kp + \delta kp = Kp$, $ki1 + \delta ki = Ki$, and $ks1 + \delta ks = Ks$ are assumed, and the expression below is obtained by determining the difference between Expression (34) and Expression (35):

Math. 30

$$0 = (ko2+1)VGp - KoVGn - (ko2+ke)VGp + KpVGn \tag{38}$$

$$VGp = \frac{Kp - Ko}{ke - 1}VGn$$

Determining the difference between Expression (35) and Expression (32) and substituting Expression (36) provides expressions of VGn and VGp:

Math. 31

$$0 = (ki2+1)VGp - KiVGn - (ko2+1)VGp + KoVGn + Vref$$

$$VGn = \frac{Vref}{(ki2-ko2)\frac{Kp-Ko}{ke-1} - Ki + Ko} \tag{39}$$

$$VGp = \frac{\frac{Kp-Ko}{ke-1}}{(ki2-ko2)\frac{Kp-Ko}{ke-1} - Ki + Ko}Vref \tag{40}$$

When Vref−Vofc>Vin, determining the difference between Expression (37) and Expression (32) and substituting Expression (39) and Expression (40) gives:

Math. 32

$$0 = (ki2 - kvc)VGp - (Ki - Kv)VGn - Vin$$

$$Vin = (ki2 - kvc)\frac{\frac{Kp-Ko}{ke-1}}{(ki2-ko2)\frac{Kp-Ko}{ke-1} - Ki + Ko}Vref -$$

$$(Ki - Kv)\frac{Vref}{(ki2-ko2)\frac{Kp-Ko}{ke-1} - Ki + Ko}$$

$$Vin = \frac{(ki2-kvc)\frac{Kp-Ko}{ke-1} - (Ki-Kv)}{(ki2-ko2)\frac{Kp-Ko}{ke-1} - Ki + Ko}Vref \tag{41}$$

$\delta kv$, $\delta ki$, $\delta kp$, and $\delta ko$ contained in Expression (41) are real numbers equal to or greater than 0 and less than 1, but their specific values are unknown. Due to this uncertainty of $\delta kv$, $\delta ki$, $\delta kp$, and $\delta ko$, a possible value of Vin has a range. A calibration value of Vin is determined by the median of the range of Vin. Partial differential of Expression (41) with $\delta kv$, $\delta ki$, $\delta ko$, and $\delta kp$ gives:

Math. 33

$$\frac{\partial Vin}{\partial(\delta ki)} = \frac{-Vref}{(ki2-ko2)\frac{Kp-Ko}{ke-1}Ki+Ko} - \tag{42}$$

$$\frac{\left\{(ki2-kvc)\frac{Kp-Ko}{ke-1} - (Ki-Kv)\right\}(-1)}{\left\{(ki2-ko2)\frac{Kp-Ko}{ke-1} - Ki + Ko\right\}^2}Vref$$

$$-\left\{(ki2-ko2)\frac{Kp-Ko}{ke-1}Ki+Ko\right\} +$$

$$= \frac{\left\{(ki2-kvc)\frac{Kp-Ko}{ke-1} - (Ki-Kv)\right\}}{\left\{(ki2-ko2)\frac{Kp-Ko}{ke-1} - Ki + Ko\right\}^2}Vref$$

$$= \frac{-(kvc-ko2)\frac{Kp-Ko}{ke-1} + Kv + Ko}{\left\{(ki2-ko2)\frac{Kp-Ko}{ke-1} - Ki + Ko\right\}^2}Vref < 0$$

$$\frac{\partial Vin}{\partial(\delta kp)} = \frac{1}{ke-1}\frac{(ki2-kvc)Vref}{(ki2-ko2)\frac{Kp-Ko}{ke-1} - Ki + Ko} - \tag{44}$$

$$\frac{1}{ke-1}\frac{\left\{(ki2-kvc)\frac{Kp-Ko}{ke-1} - (Ki-Kv)\right\}(ki2-ko2)}{\left\{(ki2-ko2)\frac{Kp-Ko}{ke-1} - Ki + Ko\right\}^2}Vref$$

$$= \frac{\left\{(ki2-ko2)\frac{Kp-Ko}{ke-1} - Ki + Ko\right\}(ki2-kvc) -}{(ke-1)\left\{(ki2-ko2)\frac{Kp-Ko}{ke-1} - Ki + Ko\right\}^2}Vref$$

$$= \frac{-(Ki-Ko)(ki2-kvc) + (Ki-Kv)(ki2-ko2)}{(ke-1)\left\{(ki2-ko2)\frac{Kp-Ko}{ke-1} - Ki + Ko\right\}^2}Vref$$

$$\frac{\partial Vin}{\partial(\delta ko)} = \frac{1}{ke-1}\frac{-(ki2-kvc)}{(ki2-ko2)\frac{Kp-Ko}{ke-1} - Ki + Ko}Vref - \tag{45}$$

$$\frac{1}{ke-1}\frac{\left\{(ki2-kvc)\frac{Kp-Ko}{ke-1} - (Ki-Kv)\right\}(-(ki2-ko2)+1)}{\left\{(ki2-ko2)\frac{Kp-Ko}{ke-1} - Ki + Ko\right\}^2}Vref$$

$$= \frac{-\left\{(ki2-ko2)\frac{Kp-Ko}{ke-1} - Ki + Ko\right\}\{(ki2-kvc)\} +}{(ke-1)\left\{(ki2-ko2)\frac{Kp-Ko}{ke-1} - Ki + Ko\right\}^2}Vref$$

$$= \frac{-\left\{(ki2-kvc)\frac{Kp-Ko}{ke-1} - (Ki-Kv)\right\}}{(ke-1)\left\{(ki2-ko2)\frac{Kp-Ko}{ke-1} - Ki + Ko\right\}^2}Vref < 0$$

From Expressions (42), (43) and (45), Vin is monotone decreasing for $\delta ki$ and $\delta ko$ and is monotone increasing for $\delta kv$. From Expression (44), Vin is monotone increasing for $\delta kp$ when $(Ki-Ko)(ki2-kvc) < (Ki-Kv)(ki2-ko2)$. Thus, the range of Vin is represented by:

Math. 34

$$\frac{(ki2-kvc)\frac{kp-ko-1}{ke-1}-(ki-kv+1)}{(ki2-ko2)\frac{kp-ko-1}{ke-1}-ki+ko}Vref < \tag{46}$$

$$Vin < \frac{(ki2-kvc)\frac{kp-ko+1}{ke-1}-(ki-kv-1)}{(ki2-ko2)\frac{kp-ko+1}{ke-1}-ki+ko}Vref$$

From Expression (46), the calibration value Vinc, which is the median of Vin, is obtained as:

Math. 35

$$Vinc = \frac{Vref}{2}\left\{\frac{(ki2-kvc)\frac{kp-ko-1}{ke-1}-(ki-kv+1)}{(ki2-ko2)\frac{kp-ko-1}{ke-1}-ki+ko} + \right. \tag{47}$$

$$\left.\frac{(ki2-kvc)\frac{kp-ko+1}{ke-1}-(ki-kv-1)}{(ki2-ko2)\frac{kp-ko+1}{ke-1}-ki+ko}\right\}$$

When $(Ki-Ko)(ki2-kvc) > (Ki-Kv)(ki2-ko2)$, Vin is monotone decreasing for $\delta kp$, so the range of Vin is represented by:

Math. 36

$$\frac{(ki2-kvc)\frac{kp-ko}{ke-1}-(ki-kv+1)}{(ki2-ko2)\frac{kp-ko}{ke-1}-ki+ko}Vref < \tag{48}$$

$$Vin < \frac{(ki2-kvc)\frac{kp-ko}{ke-1}-(ki-kv-1)}{(ki2-ko2)\frac{kp-ko}{ke-1}-ki+ko}Vref$$

From Expression (46), the calibration value Vinc, which is the median of Vin, is obtained as:

Math. 37

$$Vinc = \frac{Vref}{2}\left\{\frac{(ki2-kvc)\frac{kp-ko}{ke-1}-(ki-kv+1)}{(ki2-ko2)\frac{kp-ko}{ke-1}-ki+ko} + \right. \tag{49}$$

$$\left.\frac{(ki2-kvc)\frac{kp-ko}{ke-1}-(ki-kv-1)}{(ki2-ko2)\frac{kp-ko}{ke-1}-ki+ko}\right\}$$

When Vref−Vofc<Vin, the difference between Expression (37) and Expression (36) is determined and the expression below is obtained:

Math. 38

$$0 = (ki2-ks2)VGp - (Ki-Ks)VGn - Vs \tag{50}$$

Determining the difference between Expression (37) and Expression (33) and the expression below is obtained:

Math. 39

$$0 = (ki2-kvc)VGp - (Ki-Kv)VGn - Vin + Vs$$

$$Vin = (ki2-kvc)VGp - (Ki-Kv)VGn + Vs \tag{51}$$

Determining the sum of Expression (50) and Expression (51) and substituting Expression (39) and Expression (40) provides:

Math. 40

$$Vin = (2ki2-kvc-ks2)VGp - (2Ki-Kv-Ks)VGn$$

$$Vin = (2ki2-kvc-ks2)\frac{\frac{Kp-Ko}{ke-1}}{(ki2-ko2)\frac{Kp-Ko}{ke-1}-Ki+Ko}Vref -$$

$$(2Ki-Kv-Ks)\frac{Vref}{(ki2-ko2)\frac{Kp-Ko}{ke-1}-Ki+Ko}$$

$$Vin = \frac{(2ki2-kvc-ks2)\frac{Kp-Ko}{ke-1}-(2Ki-Kv-K5)}{(ki2-ko2)\frac{Kp-Ko}{ke-1}-Ki+Ko}Vref \tag{52}$$

Partial differential of Expression (52) with $\delta kv$, $\delta ki$, $\delta ko$, $\delta kp$, and $\delta ks$ gives:

Math. 41

$$\frac{\partial Vin}{\partial(\delta kv)} = \frac{Vref}{(ki2-ko2)\frac{Kp-Ko}{ke-1}-Ki+Ko} > 0 \tag{53}$$

$$\frac{\partial Vin}{\partial(\delta ks)} = \frac{Vref}{(ki2-ko2)\frac{Kp-Ko}{ke-1}-Ki+Ko} > 0 \tag{54}$$

$$\frac{\partial Vin}{\partial(\delta ki)} = \frac{-2Vref}{(ki2-ko2)\frac{Kp-Ko}{ke-1}-Ki+Ko} - \tag{55}$$

$$\frac{\left\{(2ki2-kvc-ks2)\frac{Kp-Ko}{ke-1}-(2Ki-Kv-Ks)\right\}(-1)}{\left\{(ki2-ko2)\frac{Kp-Ko}{ke-1}-Ki+Ko\right\}^2}Vref$$

$$= \frac{-2(ki2-ko2)\frac{Kp-Ko}{ke-1}+2Ki-2Ko+}{\left\{(ki2-ko2)\frac{Kp-Ko}{ke-1}-Ki+Ko\right\}^2}Vref$$

$$= \frac{(2ko2-kvc-ks2)\frac{Kp-Ko}{ke-1}+Kv+Ks-2Ko}{\left\{(ki2-ko2)\frac{Kp-Ko}{ke-1}-Ki+Ko\right\}^2}Vref < 0$$

$$\frac{\partial Vin}{\partial(\delta kp)} = \frac{1}{ke-1}\frac{(2ki2-kvc-ks2)Vref}{(ki2-ko2)\frac{Kp-Ko}{ke-1}-Ki+Ko} - \tag{56}$$

$$\frac{(ki2-ko2)}{ke-1}\frac{\left\{(2ki2-kvc-ks2)\frac{Kp-Ko}{ke-1}-(2Ki-Kv-Ks)\right\}}{\left\{(ki2-ko2)\frac{Kp-Ko}{ke-1}-Ki+Ko\right\}^2}Vref$$

$$= \frac{(2ki2-kvc-ks2)\left\{(ki2-ko2)\frac{Kp-Ko}{ke-1}-Ki+Ko\right\} -}{(ke-1)\left\{(ki2-ko2)\frac{Kp-Ko}{ke-1}-Ki+Ko\right\}^2}$$

$$\frac{(ki2-ko2)\left\{(ki2-kvc-ks2)\frac{Kp-Ko}{ke-1} - (2Ki-Kv-Ks)\right\}}{(ke-1)\left\{(ki2-ko2)\frac{Kp-Ko}{ke-1}-Ki+Ko\right\}^2}Vref$$

-continued $$= \frac{(2ki2-kvc-ks2)\{-Ki+Ko\}+}{(ke-1)\left\{(ki2-ko2)\frac{Kp-Ko}{ke-1}-Ki+Ko\right\}^2} Vref$$

$$= \frac{ki2(2Ko-Kv-Ks)+}{(ke-1)\left\{(ki2-ko2)\frac{Kp-Ko}{ke-1}-Ki+Ko\right\}^2} Vref$$

$$\frac{\partial Vin}{\partial(\delta ko)} = \frac{1}{ke-1} \frac{-(2ki2-kvc-ks2)Vref}{(ki2-ko2)\frac{Kp-Ko}{ke-1}-Ki+Ko} - \quad (57)$$

$$\frac{-(kio2-ko2)+1}{ke-1}$$

$$\frac{\left\{(2ki2-kvc-ks2)\frac{Kp-Ko}{ke-1}-(2Ki-Kv-Ks)\right\}}{\left\{(ki2-ko2)\frac{Kp-Ko}{ke-1}-Ki+Ko\right\}^2} Vref$$

$$= \frac{-(2ki2-kvc-ks2)\left\{(ki2-ko2)\frac{Kp-Ko}{ke-1}-Ki+Ko\right\}+}{(ki2-ko2-1)\left\{(2Ki2-kvc-ks2)\frac{Kp-Ko}{ke-1}-\right\}}{(ke-1)\left\{(ki2-ko2)\frac{Kp-Ko}{ke-1}-Ki+Ko\right\}^2} Vref$$

$$= \frac{-\left\{(2ki2-kvc-ks2)\frac{Kp-Ko}{ke-1}-(2Ki-Kv-Ks)\right\}+}{(2ki2-kvc-ks2)(Ki-Ko)+}{(ke-1)\left\{(ki2-ko2)\frac{Kp-Ko}{ke-1}-Ki+Ko\right\}^2} Vref < 0$$

From Expressions (53), (54), (55) and (57), Vin is monotone decreasing for δki and δko and is monotone increasing for δkv and δks. When ∂Vin/∂(δkp)>0, Vin is monotone increasing for δkp, so the range of Vin is represented by:

Math. 42

$$\frac{(2ki2-kvc-ks2)\frac{kp-ko-1}{ke-1}-(2ki-kv-ks+2)}{(ki2-ko2)\frac{kp-ko-1}{ke-1}ki+ko} Vref < \quad (58)$$

$$Vin < \frac{(2ki2-kvc-ks2)\frac{kp-ko+1}{ke-1}-(2ki-kv-ks-2)}{(ki2-ko2)\frac{kp-ko+1}{ke-1}-ki+ko} Vref$$

From Expression (58), the calibration value Vinc, which is the median of Vin, is obtained as:

Math. 43

$$Vinc = \frac{Vref}{2}\left\{\frac{(2ki2-kvc-ks2)\frac{kp-ko-1}{ke-1}-(2ki-kv-ks+2)}{(ki2-ko2)\frac{kp-ko-1}{ke-1}-ki+ko} + \quad (59)\right.$$

$$\left.\frac{(2ki2-kvc-ks2)\frac{kp-ko+1}{ke-1}-(2ki-kv-ks-2)}{(ki2-ko2)\frac{kp-ko+1}{ke-1}-ki+ko}\right\}$$

When ∂Vin/∂(δkp)<0, Vin is monotone decreasing for δkp, so the range of Vin is represented by:

Math. 44

$$\frac{(2ki2-kvc-ks2)\frac{kp-ko}{ke-1}-(2ki-kv-ks+2)}{(ki2-ko2)\frac{kp-ko}{ke-1}ki+ko} Vref < \quad (60)$$

$$Vin < \frac{(2ki2-kvc-ks2)\frac{kp-ko}{ke-1}-(2ki-kv-ks-2)}{(ki2-ko2)\frac{kp-ko}{ke-1}-ki+ko} Vref$$

From Expression (60), the calibration value Vinc, which is the median of Vin, is obtained as:

Math. 45

$$Vinc = \frac{Vref}{2}\left\{\frac{(2ki2-kvc-ks2)\frac{kp-ko}{ke-1}(2ki-kv-ks+2)}{(ki2-ko2)\frac{kp-ko}{ke-1}-ki+ko} + \quad (61)\right.$$

$$\left.\frac{(2ki2-kvc-ks2)\frac{kp-ko}{ke-1}-(2ki-kv-ks-2)}{(ki2-ko2)\frac{kp-ko}{ke-1}-ki+ko}\right\}$$

As has been described above, the AD converter 200 in the first variation includes a summation and conversion unit 50 including the summation section 52, and the calibration control section 41 including the difference voltage measurement processing portion 410.

The summation section 52 includes a coarse adjustment positive unit voltage VGp2 having a largest absolute value among the unit voltages; a fine adjustment positive unit voltage VGp1 having a smaller absolute value than the coarse adjustment positive unit voltage VGp2; and a difference computation portion 520 that charges the capacitance Co with a voltage equal to a difference between the input voltage and a predetermined base voltage generated by the base voltage portion 521.

The calibration control section 41 includes the difference voltage measurement processing portion 410 that, when the summed voltage resulting from summation of the coarse adjustment positive unit voltage VGp2 exceeds a voltage equal to a sum of the reference voltage Vref and the offset voltage of the comparator 34, performs summation of the summed voltage further with the fine adjustment positive unit voltage VGp1.

This enables the converted value Vinc of the input voltage to be obtained using summation counts acquired in calibration and conversion even if the offset of the comparator 34, the capacitance Co defining the unit of summation, and the like vary due to change over time, so that an AD converter with high long-term stability can be provided.

Second Embodiment

Figure 13:
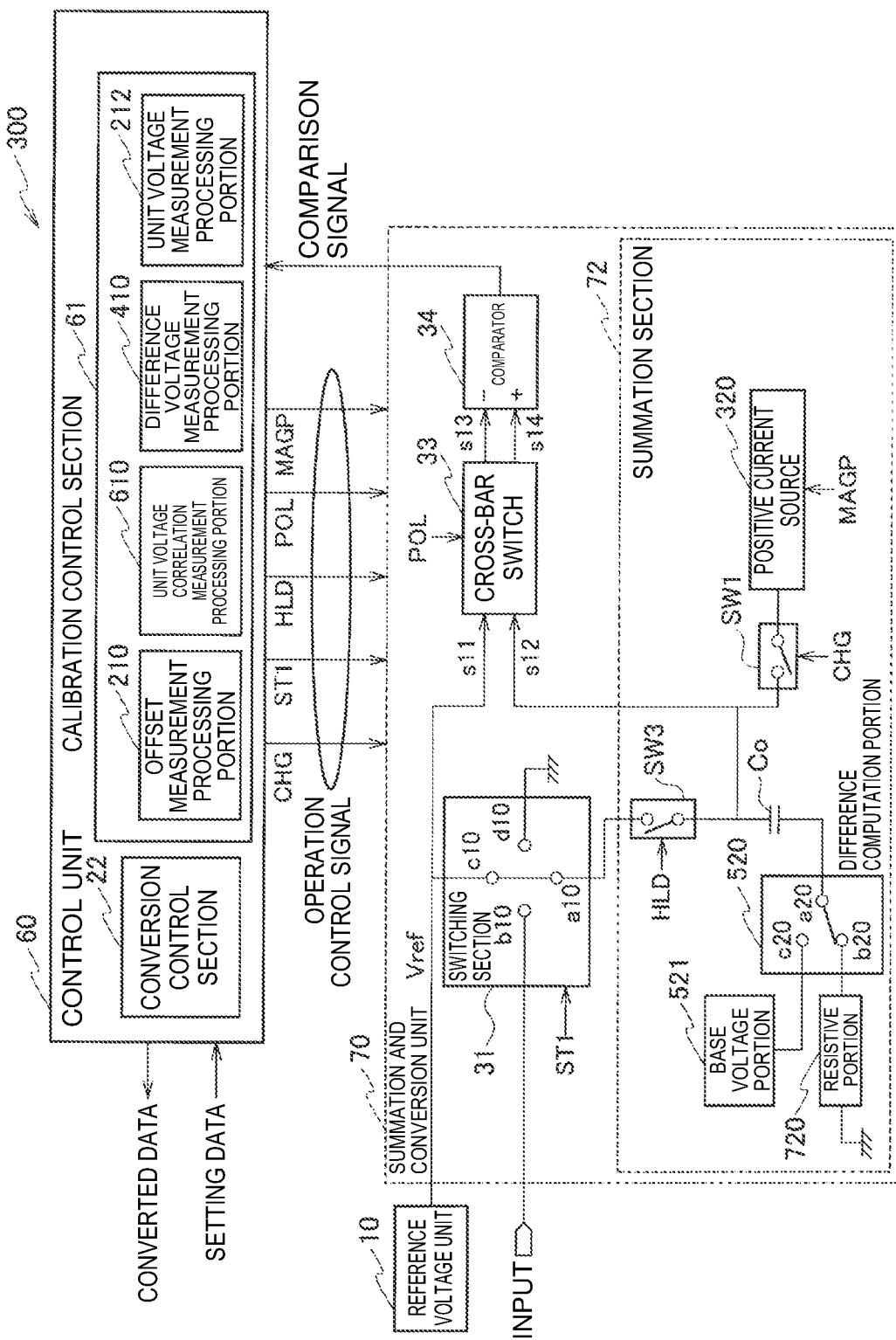
FIG. 13 is a functional block diagram showing an exemplary configuration of an AD converter with self-calibration function according to a second embodiment of the present invention.

FIG. 13 is a functional block diagram showing an exemplary configuration of an AD converter 300 according to a second embodiment of the present invention. The AD converter 300 shown in FIG. 13 differs from the first embodiment in that it includes a summation and conversion unit 70 not equipped with the negative current source 321. Although the exemplary configuration of FIG. 13 generates two kinds of unit voltages with a single kind of current value (the positive current source 320), two or more kinds of unit voltages generated with two or more kinds of current values may be summed up.

The summation and conversion unit 70 can make the input voltage range from the supply voltage to the ground through processing that holds the difference between the input voltage and the base voltage as an initial value when the input voltage is greater than the reference voltage, and enables coarse adjustment and fine adjustment only with the positive current source 320 by provision of a resistive portion 720 between the capacitance Co and the ground.

A summation section 72 includes the capacitance Co that produces a summed voltage with a charge accumulated therein, the base voltage portion 521 that outputs the base voltage Vbs, the difference computation portion 520 that switches connection when a difference between the input voltage and the base voltage is held in the capacitance Co, the resistive portion 720 that is connected between the capacitance Co and the ground when a terminal of the capacitance Co that is different from the terminal connected with the current source is connected to the ground, the positive current source 320 for producing a coarse adjustment positive unit voltage and a fine adjustment positive unit voltage, the SW1 that connects and disconnects the capacitance Co and the positive current source 320, and the SW3 that is connected when an initial value is given to the capacitance Co.

As the operations in determining the difference between the input voltage Vin and the base voltage Vbs are the same as those in the summation section 52 shown in FIG. 7, they are not described again.

Figure 14:
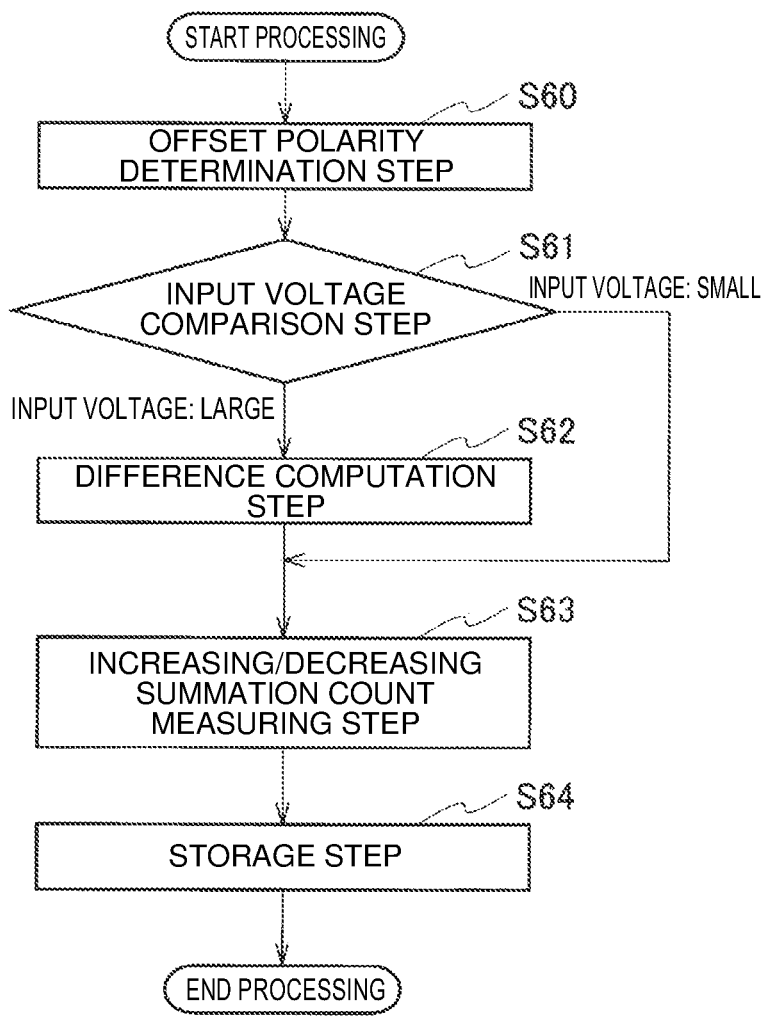
FIG. 14 is a flowchart illustrating a processing procedure of the conversion control section shown in FIG. 13.

FIG. 14 shows a processing flow of the conversion control section 22 which is performed in the summation section 72 during conversion. It is different from the processing flow (FIG. 10) of the conversion control section 22 in the first variation of the summation section 52 shown in FIG. 7 in that a coarse/fine adjustment switching summation count measuring step S63 is used. In the coarse/fine adjustment switching summation count measuring step S63, summation of the unit voltage is performed first with the coarse adjustment positive unit voltage VGp2 and then with the fine adjustment positive unit voltage VGp1. The current value of the positive current source with the coarse adjustment positive unit voltage VGp2 and the fine adjustment positive unit voltage VGp1 are denoted as I2 and I1, respectively. FIGS. 15(a) and (b) show a relationship between the summed voltage at the summation section 72 and the current value, and a summation count k. During summation with VGp2, a current of I2 flows from the positive current source 320 not only to the capacitance Co but also to the resistive portion. Representing the resistance of the resistive portion as Rg, a voltage of Rg I2 is superposed on the summed voltage at a moment the current of I2 is flowing. At a point when the current of I2 has ceased flowing, the voltage generated in the resistive portion 720 becomes zero, so the summed voltage follows Expression (1). In the summation section 72, when the voltage that results when the voltage generated in the resistive portion 720 is superposed on the summed voltage while a current for producing VGp2 is flowing from the positive current source 320 exceeds the sum of the reference voltage Vref and the offset voltage, the current of the positive current source 320 is switched to a current for producing VGp1. Given that "the sum of the reference voltage Vref and the offset voltage<the summed voltage" is reached at the kvc-th summation with VGp2, kvc is defined as coarse adjustment summation count. Given that "the sum of the reference voltage Vref and the offset voltage<the summed voltage" is reached at the kvf+1th summation from the start of summation with VGp1, kvf is defined as fine adjustment summation count. In a storage step S64, kvc and kvf are stored. The relationship between Vin and the coarse adjustment summation count kvc and the fine adjustment summation count kvf when the input voltage Vin is Vref−Vofc>Vin is represented by:

Math. 46

$$\text{Vref}-\text{Vofc}=\text{kvc VGp2}+(\text{kvf}+\delta\text{kv})\text{VGp1}+\text{Vin} \tag{62}$$

In Expression (62), VGp1δkv represents the difference between the sum of the reference voltage and the offset voltage, and the summed voltage Vref immediately before a change of state in the comparison signal, where δkv is a real number equal to or greater than 0 and less than 1.

The relationship between Vin and kvc, kvf when the input voltage Vin is Vref−Vofc<Vin is represented by:

Math. 47

$$\text{Vref}-\text{Vofc}=\text{kvc VGp2}+(\text{kvf}+\delta\text{kv})\text{VGp1}+\text{Vin}-\text{Vs} \tag{63}$$

In calibration, offset measurement processing, unit voltage correlation measurement processing, difference voltage measurement processing, and unit voltage measurement processing are performed in the offset measurement processing portion, the unit voltage correlation measurement processing portion, the difference voltage measurement processing portion, and the unit voltage measurement processing portion, respectively. A difference of the offset measurement processing from the first variation of the summation section 52 in FIG. 7 is that the increasing/decreasing summation count measuring step is replaced with the coarse/fine adjustment switching summation count measuring step. Given that "the sum of the reference voltage and the offset voltage<the summed voltage" is reached at the ko2-th summation with VGp2, ko2 is defined as coarse adjustment offset summation count, and given that "the sum of the reference voltage and the offset voltage<the summed voltage" is reached at the ko1+1th summation from the start of summation with VGp1, ko1 is defined as fine adjustment offset summation count. A relational expression of the summed voltage and the reference voltage is represented by:

Math. 48

$$\text{Vref}-\text{Vofc}=\text{ko2 VGp2}+(\text{ko1}+\delta\text{ko})\text{VGp1}+\text{Vref} \tag{64}$$

Figure 16:
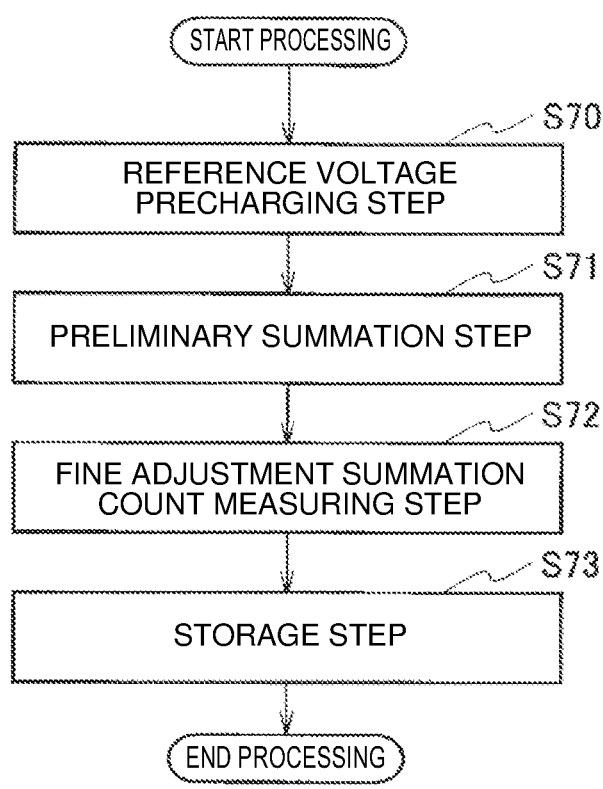
FIG. 16 is a flowchart illustrating a processing procedure of the unit voltage correlation measurement processing portion shown in FIG. 13.

A processing flow of the unit voltage correlation measurement processing is shown in FIG. 16. As a reference voltage precharging step S70 is the same as in the embodiment of FIG. 1 and the first variation of the summation section 52 of FIG. 7, it is not described again. In a preliminary summation step S71, summation is performed with VGp2 a number of times that is one less than the coarse adjustment offset summation count ko2 acquired in the offset measurement processing. After that, in a fine adjustment summation count step S72, summation is performed with VGp1 until the sum of the reference voltage Vref and the offset voltage>the summed voltage. Given that "the sum of the reference voltage Vref and the offset voltage>the summed voltage" is reached at the kp+1th summation with VGp1, kp is defined as positive correlation summation count. A relational expression of the summed voltage and the reference voltage Vref is represented by:

Math. 49

$$\text{Vref}-\text{Vofc}=(\text{ko2}-1)\text{VGp2}+(\text{kp}+\delta\text{kp})\text{VGp1}+\text{Vref} \tag{65}$$

A difference of the difference voltage measurement processing and the unit voltage measurement processing from the first variation of the summation section 52 in FIG. 7 is that the increasing/decreasing summation count measuring step is replaced with the coarse/fine adjustment switching summation count measuring step. In the difference voltage measurement processing, given that "the sum of the reference voltage Vref and the offset voltage<the summed voltage" is reached at the ks2-th summation with the coarse adjustment positive unit voltage, ks2 is defined as coarse adjustment difference voltage summation count, and given that "the sum of the reference voltage Vref and the offset voltage<the summed voltage" is reached at the ks1+1th summation from the start of summation with the fine adjustment positive unit voltage, ks1 is defined as fine adjustment difference voltage summation count.

In the unit voltage measurement processing, given that "the sum of the reference voltage Vref and the offset voltage<the summed voltage" is reached at the ki2-th summation with the coarse adjustment positive unit voltage, ki2 is defined as coarse adjustment unit voltage summation count. In the unit voltage measurement processing, given that "the sum of the reference voltage Vref and the offset voltage<the summed voltage" is reached at the ki1+1th summation from the start of summation with the fine adjustment positive unit voltage, ki1 is defined as fine adjustment unit voltage summation count. A relationship between the reference voltage Vref and the summed voltage in the respective cases is represented by:

Math. 50

$$Vref - Vofc = ks2\ VGp2 + (ks1 + \delta ks)VGp1 + Vs \quad (66)$$

$$Vref - Vofc = ki2\ VGp2 + (ki1 + \delta ki)VGp1 \quad (67)$$

The difference voltage measurement processing does not have to be performed when the input voltage is lower than the reference voltage.

To simplify notation, $kvf + \delta kv = Kv$, $ko1 + \delta ko = Ko$, $kp + \delta kp = Kp$, $ki1 + \delta ki = Ki$, and $ks1 + \delta ks = Ks$ are assumed, and the expression below is obtained by determining the difference between Expression (64) and Expression (65).

Math. 51

$$0 = VGp2 + (Ko - Kp)VGp1$$

$$VGp2 = (Kp - Ko)VGp1 \quad (68)$$

Determining the difference between Expression (65) and Expression (63) and substituting Expression (66) gives:

Math. 52

$$0 = (ki2 - ko2)(Kp - Ko)VGp1 + (Ki - Ko)VGp1 - Vref$$

$$VGp1 = \frac{1}{(ki2 - ko2)(Kp - Ko) + (Ki - Ko)} Vref \quad (69)$$

When Vref−Vofc>Vin, determining the difference between Expression (67) and Expression (62) and substituting Expression (68) and Expression (69) gives:

Math. 53

$$0 = (ki2 - kvc)VGp2 + (Ki - Kv)VGp1 - Vin$$

$$Vin = \frac{(ki2 - kvc)(Kp - Ko) + (Ki - Kv)}{(ki2 - ko2)(Kp - Ko) + (Ki - Ko)} Vref \quad (70)$$

$\delta kv$, $\delta ki$, $\delta kp$, and $\delta ko$ contained in Expression (70) are real numbers equal to or greater than 0 and less than 1, but their specific values are unknown. Due to this uncertainty of $\delta kv$, $\delta ki$, $\delta kp$, and $\delta ko$, a possible value of Vin has a range. A calibration value of Vin is determined from the median of the range of Vin. Partial differential of Expression (70) with $\delta kv$, $\delta ki$, $\delta ko$, and $\delta kp$ gives:

Math. 54

$$\frac{\partial Vin}{\partial (\delta kv)} = \frac{-1}{(ki2 - ko2)(Kp - Ko) + (Ki - Ko)} Vref < 0 \quad (71)$$

$$\frac{\partial Vin}{\partial (\delta ki)} = \frac{1}{(ki2 - ko2)(Kp - Ko) + (Ki - Ko)} Vref -$$

$$\frac{\{(ki2 - kvc)(Kp - Ko) + (Ki - Kv)\}}{\{(ki2 - ko2)(Kp - Ko) + (Ki - Ko)\}^2} Vref =$$

$$\frac{(ki2 - ko2)(Kp - Ko) + (Ki - Ko) - \{(ki2 - kvc)(Kp - Ko) + (Ki - Kv)\}}{\{(ki2 - ko2)(Kp - Ko) + (Ki - Ko)\}^2} Vref$$

$$= \frac{(kvc - ko2)(Kp - Ko) + (Kv - Ko)}{\{(ki2 - ko2)(Kp - Ko) + (Ki - Ko)\}^2} Vref > 0 \quad (72)$$

$$\frac{\partial Vin}{\partial (\delta kp)} = \frac{(ki2 - kvc)}{(ki2 - ko2)(Kp - Ko) + (Ki - Ko)} Vref -$$

$$\frac{\{(ki2 - kvc)(Kp - Ko) + (Ki - Kv)\}(ki2 - ko2)}{\{(ki2 - ko2)(Kp - Ko) + (Ki - Ko)\}^2} Vref =$$

$$\frac{\{(ki2 - ko2)(Kp - Ko) + (Ki - Ko)\}(ki2 - kvc) - \{(ki2 - kvc)(Kp - Ko) + (Ki - Kv)\}(ki2 - ko2)}{\{(ki2 - ko2)(Kp - Ko) + (Ki - Ko)\}^2} Vref =$$

$$\frac{(Ki - Ko)(ki2 - kvc) - (Ki - Kv)(ki2 - ko2)}{\{(ki2 - ko2)(Kp - Ko) + (Ki - Ko)\}^2} Vref$$

$$= \frac{(Kv - Ko)ki2 - kvc(Ki - Ko) - ko2(Ki - Kv)}{\{(ki2 - ko2)(Kp - Ko) + (Ki - Ko)\}^2} Vref \quad (73)$$

$$\frac{\partial Vin}{\partial (\delta ko)} = \frac{-(ki2 - kvc)}{(ki2 - ko2)(Kp - Ko) + (Ki - Ko)} Vref -$$

$$\frac{\{(ki2 - kvc)(Kp - Ko) + (Ki - Kv)\}(-ki2 + ko2 - 1)}{\{(ki2 - ko2)(Kp - Ko) + (Ki - Ko)\}^2} Vref =$$

$$\frac{-\{(ki2 - ko2)(Kp - Ko) + (Ki - Ko)\}(ki2 - kvc) + \{(ki2 - kvc)(Kp - Ko) + (Ki - Kv)\}(ki2 - ko2 + 1)}{\{(ki2 - ko2)(Kp - Ko) + (Ki - Ko)\}^2} Vref =$$

$$\frac{(ki2 - kvc)(Kp - Ko) + (Ki - Kv) - \frac{(Ki - Ko)(ki2 - kvc) + (Ki - Kv)(ki2 - ko2)}{\{(ki2 - ko2)(Kp - Ko) + (Ki - Ko)\}^2} Vref}{}$$

$$= \frac{(ki2 - kvc)(Kp - Ki) + (Ki - Kv)(ki2 - ko2 + 1)}{\{(ki2 - ko2)(Kp - Ko) + (Ki - Ko)\}^2} Vref > 0 \quad (74)$$

From Expressions (71), (72) and (74), Vin is monotone decreasing for $\delta kv$ and monotone increasing for $\delta ki$ and $\delta ko$. When $\partial Vin/\partial(\delta kp) > 0$, Vin is monotone increasing for $\delta kp$, so the range of Vin is represented by:

Math. 55

$$\frac{(ki2 - kvc)(kp - ko) + (ki - kv - 1)}{(ki2 - ko2)(kp - ko) + (ki - ko)} Vref < \quad (75)$$

$$Vin < \frac{(ki2 - kvc)(kp - ko) + (ki - kv + 1)}{(ki2 - ko2)(kp - ko) + (ki - ko)} Vref$$

From Expression (75), the calibration value Vinc, which is the median of Vin, is obtained as:

Math. 56
$$Vin = \frac{Vref}{2}\left\{\frac{(ki2-kvc)(kp-ko)+(ki-kv-1)}{(ki2-ko2)(kp-ko)+(ko-ko)} + \frac{(ki2-kvc)(kp-ko)+(ki-kv+1)}{(ki2-ko2)(kp-ko)+(ki-ko)}\right\} \quad (76)$$

When $\partial Vin/\partial(\delta kp)<0$, Vin is monotone decreasing for $\delta kp$, so the range of Vin is represented by:

Math. 57
$$\frac{(ki2-kvc)(kp-ko+1)+(ki-kv-1)}{(ki2-ko2)(kp-ko+1)+(ki-ko)}Vref < \quad (77)$$
$$Vin < \frac{(ki2-kvc)(kp-ko-1)+(ki-kv+1)}{(ki2-ko2)(kp-ko-1)+(ki-ko)}Vref$$

From Expression (75), the calibration value Vinc, which is the median of Vin, is obtained as:

Math. 58
$$Vin = \frac{Vref}{2}\left\{\frac{(ki2-kvc)(kp-ko+1)+(ki-kv-1)}{(ki2-ko2)(kp-ko+1)+(ki-ko)} + \frac{(ki2-kvc)(kp-ko-1)+(ki-kv+1)}{(ki2-ko2)(kp-ko-1)+(ki-ko)}\right\} \quad (78)$$

When Vref−Vofc>Vin, determining the difference between Expression (67) and Expression (63) gives:
Math. 59
$$0=(ki2-kvc)\,VGp2+(Ki-Kv)VGp1-Vin+Vs \quad (79)$$

Determining the difference between Expression (67) and Expression (66) gives:
Math. 60
$$0=(ki2-ks2)\,VGp2+(Ki-Ks)VGp1-Vs \quad (80)$$

Determining the sum of Expression (79) and Expression (80) and substituting Expression (69) gives:

Math. 61
$$0 = (2ki2-kvc-ks2)VGp2 + (2Ki-Kv-Ks)VGp1 - Vin$$
$$Vin = (2ki2-kvc-ks2)VGp2 + (2Ki-Kv-Ks)VGp1$$
$$Vin = \frac{(2ki2-kvc-ks2)(Kp-Ko)+(2Ki-Kv-Ks)}{(ki2-ko2)(Kp-Ko)+(Ki-Ko)}Vref \quad (81)$$

Partial differential of Expression (81) with $\delta ks$, $\delta kv$, $\delta ki$, $\delta ko$, and $\delta kp$ gives:

Math. 62
$$\frac{\partial Vin}{\partial(\delta ks)} = \frac{-1}{(ki2-ko2)(Kp-Ko)+(Ki-Ko)}Vref < 0 \quad (82)$$
$$\frac{\partial Vin}{\partial(\delta kv)} = \frac{-1}{(ki2-ko2)(Kp-Ko)+(Ki-Ko)}Vref < 0 \quad (83)$$

-continued
$$\frac{\partial Vin}{\partial(\delta ki)} = \frac{2}{(ki2-ko2)(Kp-Ko)+(Ki-Ko)}Vref -$$
$$\frac{(2ki2-kvc-ks2)(Kp-Ko)+(2Ki-Kv-Ks)}{\{(ki2-ko2)(Kp-Ko)+(Ki-Ko)\}^2}Vref =$$
$$\frac{2\{(ki2-ko2)(Kp-Ko)+(Ki-Ko)\}-}{\{(ki2-ko2)(Kp-Ko)+(Ki-Ko)\}^2} =$$
$$= \frac{(kvc+ks2-2ko2)(Kp-Ko)+(Kv+Ks-2Ko)}{\{(ki2-ko2)(Kp-Ko)+(Ki-Ko)\}^2}Vref > 0 \quad (84)$$

$$\frac{\partial Vin}{\partial(\delta kp)} = \frac{(2ki2-kvc-ks2)}{(ki2-ko2)(Kp-Ko)+(Ki-Ko)}Vref -$$
$$\frac{\{(2ki2-kvc-ks2)(Kp-Ko)+(2Ki-Kv-Ks)\}(ki2-ko2)}{\{(ki2-ko2)(Kp-Ko)+(Ki-Ko)\}^2}Vref =$$
$$\frac{\{(ki2-ko2)(Kp-Ko)+(Ki-Ko)\}(2ki2-kvc-ks2)-}{\{(2ki2-kvc-ks2)(Kp-Ko)+(2Ki-Kv-Ks)\}(ki2-ko2)}{\{(ki2-ko2)(Kp-Ko)+(Ki-Ko)\}^2} =$$
$$= \frac{(Ki-Ko)(2ki2-kvc-ks2)-(2Ki-Kv-Ks)(ki2-ko2)}{\{(ki2-ko2)(Kp-Ko)+(Ki-Ko)\}^2}Vref \quad (85)$$

$$\frac{\partial Vin}{\partial(\delta ko)} = \frac{-(2ki2-kvc-ks2)}{(ki2-ko2)(Kp-Ko)+(Ki-Ko)}Vref -$$
$$\frac{\{(2ki2-kvc-ks2)(Kp-Ko)+}{(2Ki-Kv-Ks)\}(-ki2+ko2-1)}{\{(ki2-ko2)(Kp-Ko)+(Ki-Ko)\}^2}Vref =$$
$$-\{(ki2-ko2)(Kp-Ko)+(Ki-Ko)\}(2ki2-kvc-ks2)+$$
$$\frac{\{(2ki2-kvc-ks2)(Kp-Ko)+}{(2Ki-Kv-Ks)\}(ki2-ko2+1)}{\{(ki2-ko2)(Kp-Ko)+(Ki-Ko)\}^2}Vref =$$
$$\frac{(2ki2-kvc-ks2)(Kp-Ko)+(2Ki-Kv-Ks)-}{(Ki-Ko)(2ki2-kvc-ks2)+(2Ki-Kv-Ks)(ki2-ko2)}{\{(ki2-ko2)(Kp-Ko)+(Ki-Ko)\}^2}$$
$$= \frac{(2ki2-kvc-ks2)(Kp-Ki)+}{(2Ki-Kv-Ks)+(2Ki-Kv-Ks)(ki2-ko2)}{(\{(ki2-ko2)(Kp-Ko)+(Ki-Ko)\}^2)} \quad (86)$$

From Expressions (82), (83), (84) and (86), Vin is monotone decreasing for $\delta kv$ and $\delta ks$ and monotone increasing for $\delta ki$ and $\delta ko$. When $\partial Vin/\partial(\delta kp)>0$, Vin is monotone increasing for $\delta kp$, so the range of Vin is represented by:

Math. 63
$$\frac{(2ki2-kvc-ks2)(Kp-Ko)+(2Ki-Kv-Ks-2)}{(ki2-ko2)(Kp-Ko)+(Ki-Ko)}Vref < \quad (87)$$
$$Vin < \frac{(2ki2-kvc-ks2)(Kp-Ko)+(2Ki-Kv-Ks+2)}{(ki2-ko2)(Kp-Ko)+(Ki-Ko)}Vref$$

From Expression (87), the calibration value Vinc, which is the median of Vin, is obtained as:

Math. 64
$$Vin = \frac{Vref}{2}\left\{\frac{(2ki2-kvc-ks2)(Kp-Ko)+(2Ki-Kv-Ks-2)}{(ki2-ko2)(Kp-Ko)+(Ki-Ko)} + \frac{(2ki2-kvc-ks2)(Kp-Ko)+(2Ki-Kv-Ks+2)}{(ki2-ko2)(Kp-Ko)+(Ki-Ko)}\right\} \quad (88)$$

When ∂Vin/∂(δkp)<0, Vin is monotone decreasing for δkp, so the range of Vin is represented by:

Math. 65

$$\frac{(2ki2 - kvc - ks2)(Kp - Ko + 1) + (2Ki - Kv - Ks - 2)}{(ki2 - ko2)(Kp - Ko + 1) + (Ki - Ko)} Vref <$$

$$Vin < \frac{(2ki2 - kvc - ks2)(Kp - Ko - 1) + (2Ki - Kv - Ks + 2)}{(ki2 - ko2)(Kp - Ko - 1) + (Ki - Ko)} Vref \quad (89)$$

From Expression (87), the calibration value Vinc, which is the median of Vin, is obtained as:

Math. 66

$$Vinc = \frac{Vref}{2} \left\{ \frac{(2ki2 - kvc - ks2)(Kp - Ko + 1) + (2Ki - Kv - Ks - 2)}{(ki2 - ko2)(Kp - Ko + 1) + (Ki - Ko)} + \frac{(2ki2 - kvc - ks2)(Kp - Ko - 1) + (2Ki - Kv - Ks + 2)}{(ki2 - ko2)(Kp - Ko - 1) + (Ki - Ko)} \right\} \quad (90)$$

As described above, the AD converter 300 according to the second embodiment includes the summation and conversion unit 70 including the summation section 72, and a calibration control section including a unit voltage correlation measurement processing portion 610.

The summation and conversion unit 70 includes: a switching section 31 that connects, to a capacitance Co holding the unit voltage, the input voltage during conversion and either the reference voltage Vref or a ground voltage at the time of calibration; a summation section 72 including a positive current source 320 for, during conversion, generating a summed voltage by charging the capacitance Co with any of multiple currents of different magnitudes after the input voltage is held in the capacitance Co, and a difference computation portion 520 that connects, to an end of the capacitance Co opposite the positive current source 320, the base voltage portion 521 that generates a predetermined base voltage or a resistive portion 720 connected to a ground voltage; a cross-bar switch 33 that switches between a case where the reference voltage Vref is output to one output end and the summed voltage is output to another output end, and a case where the reference voltage Vref is output to the other output end and the summed voltage is output to the one output end; and a comparator 34 that outputs a comparison signal when a voltage at a positive input end exceeds a voltage at a negative input end while the one output end being connected with the negative input end and the other output end being connected with the positive input end.

The calibration control section 61 includes a unit voltage correlation measurement processing portion 610 that, when a summed voltage resulting from summation with a coarse adjustment positive unit voltage exceeds a sum of the reference voltage Vref and the offset voltage of the comparator 34, performs summation of the summed voltage with a fine adjustment positive unit voltage, the coarse adjustment positive unit voltage being a unit voltage generated with a positive current having a large absolute value, and the fine adjustment positive unit voltage being of a smaller absolute value than the coarse adjustment positive unit voltage.

This enables the converted value Vinc of the input voltage to be obtained using summation counts acquired in calibration and conversion even if the offset of the comparator 34, the capacitance Co defining the unit of summation, and the like vary due to change over time, so that an AD converter with high long-term stability can be provided.

In the operation of the summation section 72 described above, output and stop of the current from the positive current source 320 are performed in a single summation; however, the current of the positive current source 320 may be continuously output until "the sum of the reference voltage Vref and the offset voltage>the summed voltage" is reached at the comparator 34. Alternatively, the current of the positive current source 320 may be continuously output until "the sum of the offset voltage>the summed voltage" is reached for the coarse adjustment unit voltage, and processing for outputting and stopping current from the positive current source 320 may be performed in a single summation for the fine adjustment unit voltage. Furthermore, the current of the positive current source 320 may be continuously output until "the sum of the offset voltage>the summed voltage" is reached for the fine adjustment unit voltage, and processing for outputting and stopping current from the positive current source 320 may be performed in a single summation for the coarse adjustment unit voltage.

(Second Variation)

Figure 17:
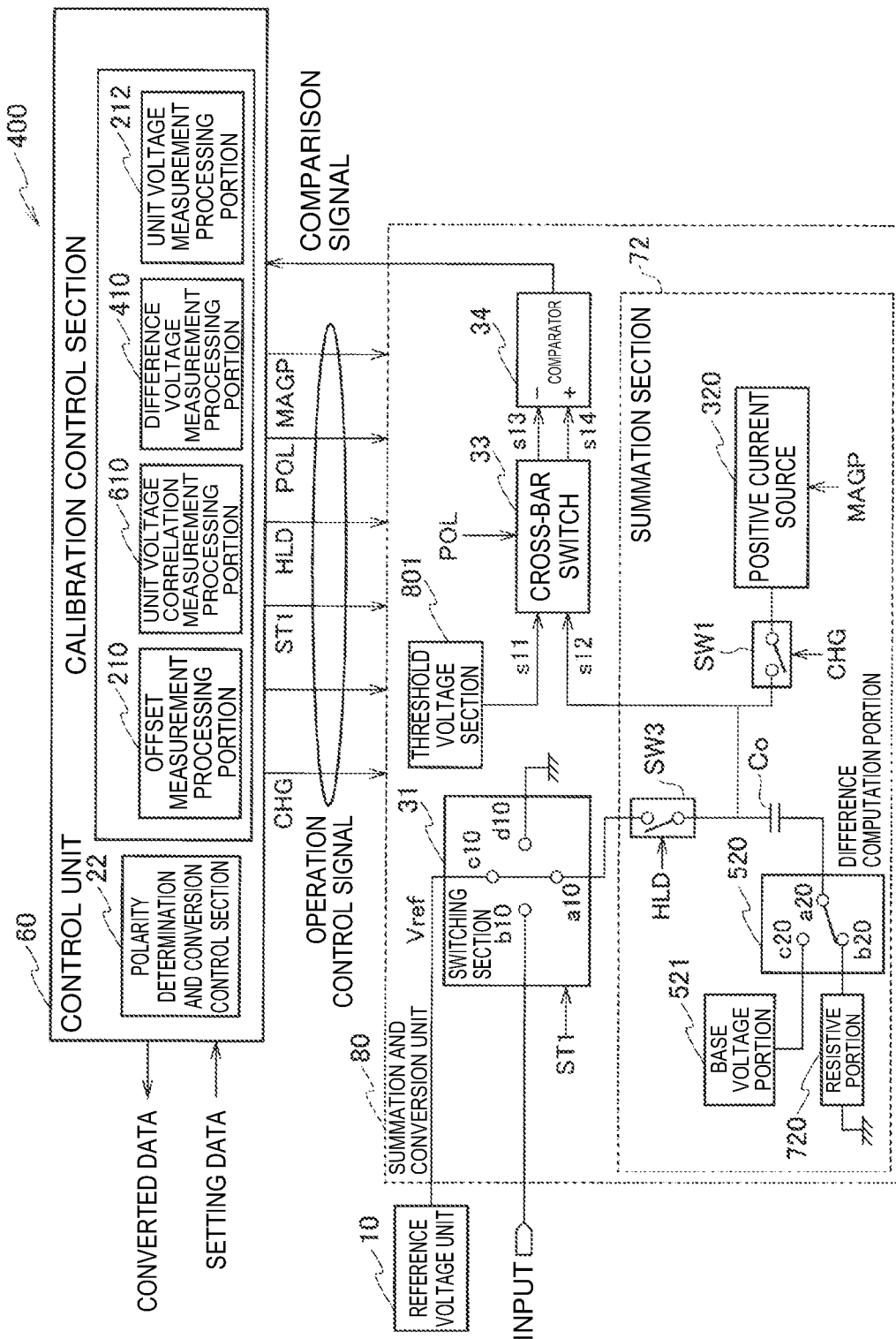
FIG. 17 is a functional block diagram showing an exemplary configuration of a variation of the AD converter with self-calibration function according to the second embodiment shown in FIG. 13.

FIG. 17 shows a functional block diagram of a second variation as a variant of the AD converter 300 according to the second embodiment of the present invention. An AD converter 400 shown in FIG. 17 differs from the AD converter 300 in that it includes a summation and conversion unit 80. The summation and conversion unit 80 includes a threshold voltage section 801.

While in the block diagram of FIG. 13 the reference voltage is compared to the summed voltage at the comparator 34, this embodiment compares the sum of a certain threshold voltage and the offset voltage to the summed voltage. For this processing, the threshold voltage section 801 is included in the summation and conversion unit 80. The configuration of the summation and conversion unit 80 except the threshold voltage section 801 is the same as in the second embodiment (FIG. 13).

As to processing by the control unit 60 as well, conversion control processing is performed at the conversion control section 60 during conversion similarly to the second embodiment. In calibration, offset measurement processing, unit voltage correlation measurement processing, difference voltage measurement processing and unit voltage measurement processing are performed in the offset measurement processing portion 210, the unit voltage correlation measurement processing portion 610, the difference voltage measurement processing portion 410, and the unit voltage measurement processing portion 212, respectively.

A relational expression of the summed voltage resulting from conversion control processing and the reference voltage Vref is the one below for comparison of the sum of a threshold voltage Vt and the offset voltage to the summed voltage at the comparator 34:

Math. 67

$$Vt-Vofc=kvc\ VGp2+(kvf+\delta kv)VGp1+Vin \quad (91)$$

$$Vt-Vofc=kvc\ VGp2+(kvf+\delta kv)VGp1+Vin-Vs \quad (92)$$

Expression (91) is a relational expression for Vt−Vofc>Vin and Expression (92) is a relational expression for Vt−Vofc>Vin.

In the offset measurement processing, the unit voltage correlation measurement processing, the difference voltage measurement processing, and the unit voltage measurement processing, the relational expressions of the summed voltage and the reference voltage Vref are respectively:

Math. 68

$$Vt-Vofc = ko2\ VGp2 + (ko1+\delta ko)VGp1 + Vref \quad (93)$$

$$Vt-Vofc = (ko2-1)VGp2 + (kp+\delta kp)VGp1 + Vref \quad (94)$$

$$Vt-Vofc = ks2\ VGp2 + (ks1+\delta ks)VGp1 + Vs \quad (95)$$

$$Vt-Vofc = ki2\ VGp2 + (ki1+\delta ki)VGp1 \quad (96)$$

The difference voltage measurement processing does not have to be performed when the input voltage is lower than the reference voltage.

To simplify notation, $kvf+\delta kv = Kv$, $ko1+\delta ko = Ko$, $kp+\delta kp = Kp$, $ki1+\delta ki = Ki$, and $ks1+\delta ks = Ks$ are assumed, and the expression below is obtained by determining the difference between Expression (93) and Expression (94):

Math. 69

$$0 = VGp2 + (Ko - Kp)VGp1$$

$$VGp2 = (Kp - Ko)VGp1 \quad (97)$$

Determining the difference between Expression (96) and Expression (93) and substituting Expression (97) gives:

Math. 70

$$0 = (ki2 - ko2)VGp2 + (Ki - Ko)VGp1 - Vref$$

$$VGp1 = \frac{1}{(ki2 - ko2)(Kp - Ko) + (Ki - Ko)} Vref \quad (98)$$

When Vt−Vofc>Vin, determining the difference between Expression (96) and Expression (91) and substituting Expression (97) and Expression (98) gives:

Math. 71

$$0 = (ki2 - kvc)VGp2 + (Ki - Kv)VGp1 0 Vin$$

$$Vin = \frac{(ki2 - kvc)(Kp - Ko) + (Ki - Kv)}{(ki2 - ko2)(Kp - Ko) + (Ki - Ko)} Vref \quad (99)$$

When Vt−Vofc<Vin, determining the sum of the difference between Expression (96) and Expression (92) and the difference between Expression (96) and Expression (95), and substituting Expression (97) and Expression (98) gives:

Math. 72

$$0 = \{(ki2 - kvc)VGp2 + (Ki - Kv)VGp1 - Vin + VS\} +$$

$$\{(ki2 - ks2)VGp2 + (Ki - Ks)VGp1 - Vs\}$$

$$Vin = (2ki2 - kvc - ks2)VGp2 + (2Ki - Kv - Ks)VGp1$$

$$Vin = \frac{(2ki2 - kvc - ks2)(Kp - Ko) + (2Ki - Kv - Ks)}{(ki2 - ko2)(Kp - Ko) + (Ki - Ko)} Vref \quad (100)$$

As Expression (99) is the same as Expression (70) and Expression (100) is the same as the Expression (81), this embodiment can also obtain the converted value Vinc of the input voltage, which is the median of the range of Vin, with similar operations to those in the second embodiment.

As described above, the AD converter 400 in the second variation includes the summation and conversion unit 80 including the threshold voltage section 801.

The AD converter 400 is an AD converter with self-calibration function that does not require an instrument for calibration, and includes: a reference voltage unit 10 that generates a reference voltage; a summation and conversion unit 80 that has two or more unit voltages serving as units of amount of change in a summed voltage, and during conversion, sums up any one unit voltage of the two or more unit voltages until the summed voltage exceeds a predetermined threshold voltage, with an input voltage being an initial value of the summed voltage; and a control unit 60 including a calibration control section 61 that calibrates the two or more unit voltages and an offset voltage of a comparator 34 at a time of calibration, and a conversion control section 22 that determines a polarity of the offset voltage of the comparator 34 and thereafter converts the input voltage to a digital value during conversion.

This enables the converted value Vinc of the input voltage to be obtained using summation counts acquired in calibration and in conversion even if the offset of the comparator 34, the capacitance Co defining the unit of summation, and the like vary due to change over time, so that an AD converter with high long-term stability can be provided.

(Third Variation)

Figure 18:
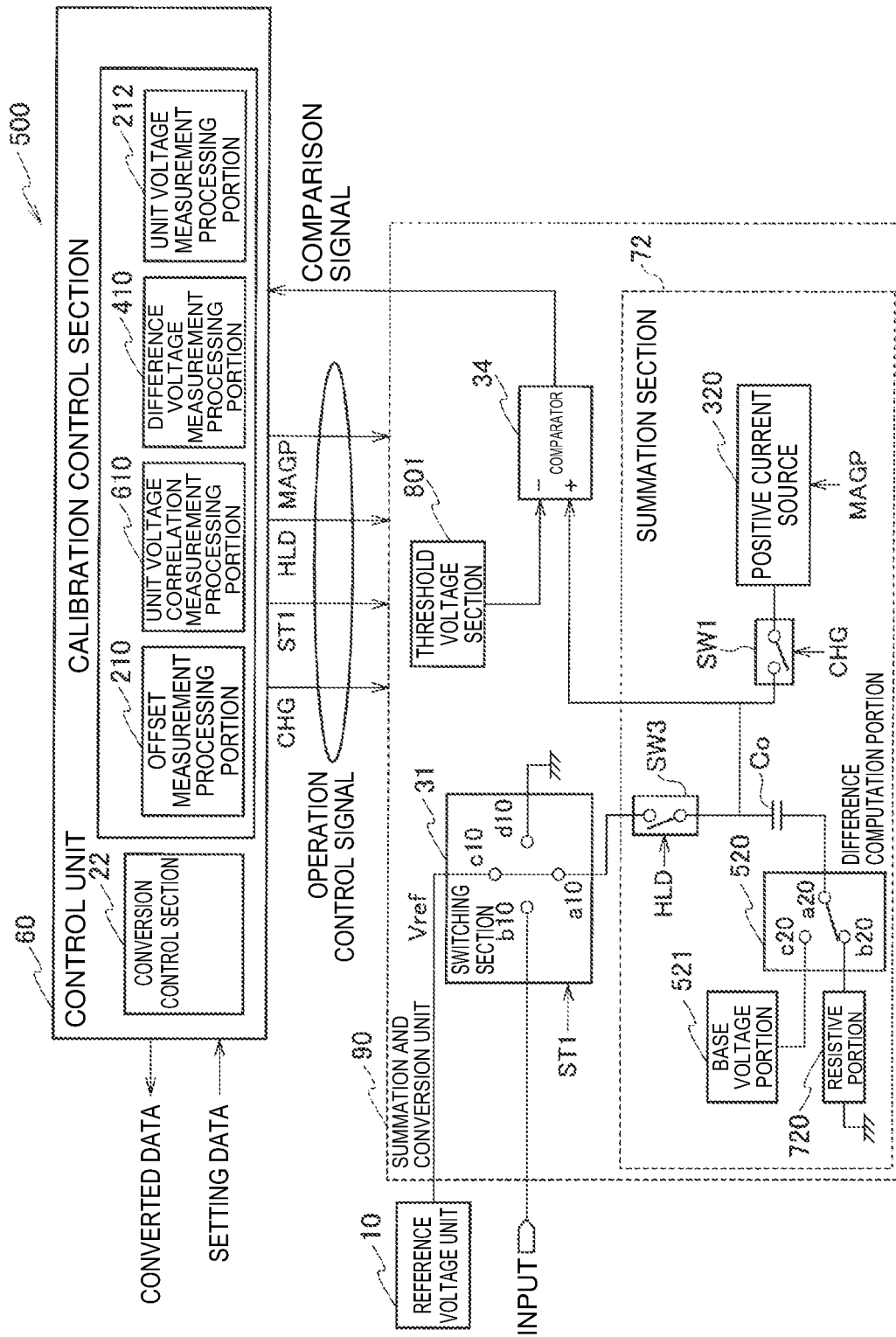
FIG. 18 is a functional block diagram showing an exemplary configuration of a variation of the AD converter with self-calibration function according to the second embodiment shown in FIG. 13.

FIG. 18 shows a functional block diagram of a third variation as a variant of the second embodiment of the present invention.

The third variation can be applied in a case where the difference between the threshold voltage Vt and the reference voltage Vref and the difference between the threshold voltage Vt and the difference voltage Vs are set sufficiently larger than the offset voltage Vofc of the comparator 34 and where the summation section 72 is used.

Since the sign of the coarse adjustment unit voltage is positive in the second embodiment (FIG. 13) and the second variation (FIG. 17), an initial value of summation needs to be lower than the sum of or the difference between the threshold voltage and the offset voltage, i.e., the end point of summation. In Expression (91) through Expression (96), a voltage lower than Vt−Vofc on the left side has to be the initial value. Accordingly, Vt, Vref, and Vs should be set such that Vt−Vofc>Vref and Vt−Vofc>Vs, that is, Vt−Vref>Vofc and Vt−Vs>Vofc.

Figure 19:
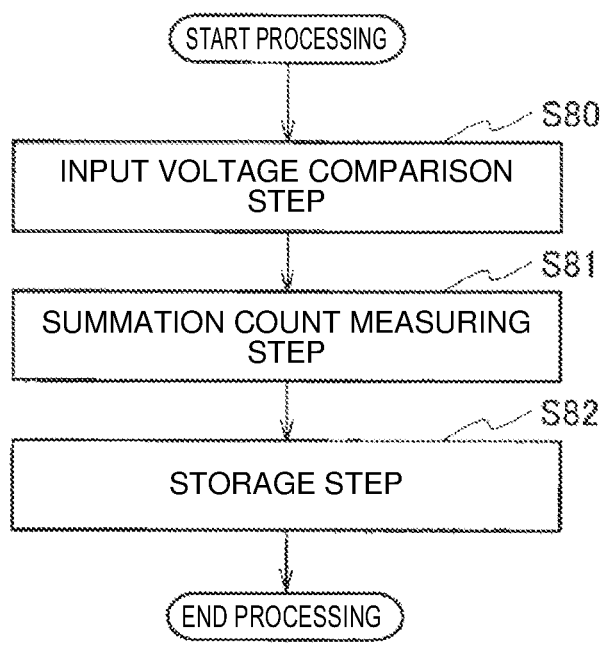
FIG. 19 is a flowchart illustrating a processing procedure of the conversion control section shown in FIG. 18.

Since the third variation does not require processing for determining the polarity of the offset, the conversion control section 22 performs conversion control processing during conversion. As shown in FIG. 19, a processing flow of the conversion control section 22 is a flow excluding the polarity determination step S1 from the flow shown in FIG. 3. As processing in calibration is the same as that in the block diagram of FIG. 17, it is not described again.

As described above, an AD converter 500 in the third variation includes a summation and conversion unit 90 including the threshold voltage section 801.

The summation and conversion unit 90 includes: a switching section 31 that connects, to a capacitance Co holding the unit voltage, the input voltage during conversion and either the reference voltage Vref or a ground voltage at the time of calibration; a summation section 72 that, during conversion, makes the input voltage be held in the capacitance Co and thereafter sums any one of the two or more unit voltages to the voltage being held to generate a summed voltage, and at the time of calibration, makes the reference voltage or the ground voltage be held in the capacitance Co and thereafter sums any one of the two or more unit voltages to the voltage being held to generate a summed voltage; a threshold voltage section 801 that generates the threshold voltage; and the comparator 34 that outputs a comparison signal when the summed voltage exceeds the threshold voltage while the threshold voltage being connected with a negative input end and the summed voltage being connected with a positive input end.

The third variation enables the converted value Vinc of the input voltage to be obtained using summation counts acquired in calibration and in conversion even if the offset of the comparator 34, the capacitance Co defining the unit of summation, and the like vary due to change over time, so that an AD converter with high long-term stability can be provided.

REFERENCE SIGNS LIST 10 reference voltage unit
20, 40, 60 control unit
21, 41 calibration control section
22 conversion control section
30, 50 summation and conversion unit
31 switching section
32, 52, 72 summation section
33 cross-bar switch
34 comparator
100, 200, 300, 400, 500 AD converter with self-calibration function
210 offset measurement processing portion
211 positive-negative unit voltage correlation measurement processing portion
212 unit voltage measurement processing portion
320 positive current source
321 negative current source
410 difference voltage measurement processing portion
520 difference computation portion
521 base voltage portion
610 unit voltage correlation measurement processing portion
720 resistive portion
801 threshold voltage section

The invention claimed is:

1. An AD converter with self-calibration function that does not require an instrument for calibration, the AD converter comprising:
a reference voltage unit that generates a reference voltage;
a summation and conversion unit that has two or more unit voltages serving as units of amount of change in a summed voltage, and during conversion, sums up any one unit voltage of the two or more unit voltages until the summed voltage exceeds the reference voltage, with an input voltage being an initial value of the summed voltage; and
a control unit including a calibration control section that calibrates the two or more unit voltages and an offset voltage of a comparator at a time of calibration, and a conversion control section that determines a polarity of the offset voltage of the comparator and thereafter converts the input voltage to a digital value during conversion.

2. The AD converter with self-calibration function according to claim 1, wherein the summation and conversion unit comprises:
a switching section that connects, to a capacitance holding the unit voltage, the input voltage during conversion and either the reference voltage or a ground voltage at the time of calibration;
a summation section that, during conversion, makes the input voltage be held in the capacitance and thereafter sums any one of the two or more unit voltages to the voltage being held to generate a summed voltage, and at the time of calibration, makes the reference voltage or the ground voltage be held in the capacitance and thereafter sums any one of the two or more unit voltages to the voltage being held to generate a summed voltage;
a cross-bar switch that switches between a case where the reference voltage is output to one output end and the summed voltage is output to another output end, and a case where the reference voltage is output to the other output end and the summed voltage is output to the one output end; and
the comparator that outputs a comparison signal when a voltage at a positive input end exceeds a voltage at a negative input end while the one output end being connected with the negative input end and the other output end being connected with the positive input end.

3. The AD converter with self-calibration function according to claim 1, wherein the calibration control section comprises:
an offset measurement processing portion that measures a summation count of the unit voltage that is required until an output of the comparator is inverted after the capacitance is precharged with a unit voltage equivalent to the reference voltage;
a positive-negative unit voltage correlation measurement processing portion that measures a positive-negative correlation summation count if the input voltage is greater than the reference voltage, the positive-negative correlation summation count being a number of summations that is required until the output of the comparator is inverted as a result of adding a positive unit voltage by an over-summation count equal to the summation count plus a predetermined number of times to generate a summed voltage and thereafter subtracting a negative unit voltage from the summed voltage until the summed voltage becomes smaller than the reference voltage; and
a unit voltage measurement processing portion that measures a unit voltage summation count after the unit voltage is reset, the unit voltage summation count being a number of summations of the unit voltage that is required until the output of the comparator is inverted as a result of summation of the positive unit voltage.

4. The AD converter with self-calibration function according to claim 2,
wherein the summation section comprises:
a coarse adjustment positive unit voltage having a largest absolute value among the unit voltages;
a fine adjustment positive unit voltage having a smaller absolute value than the coarse adjustment positive unit voltage; and
a difference computation portion that charges the capacitance with a voltage equal to a difference between the input voltage and a predetermined base voltage generated by a base voltage portion, and
wherein the calibration control section comprises:
a difference voltage measurement processing portion that, when a summed voltage resulting from summation of the coarse adjustment positive unit voltage exceeds a voltage equal to a sum of the reference voltage and the offset voltage of the comparator, performs summation of the summed voltage further with the fine adjustment positive unit voltage.

5. The AD converter with self-calibration function according to claim 1,
wherein the summation and conversion unit comprises:
a switching section that connects, to a capacitance holding the unit voltage, the input voltage during conversion and either the reference voltage or a ground voltage at the time of calibration;
a summation section including a positive current source for, during conversion, generating a summed voltage by charging the capacitance with any of multiple currents of different magnitudes after the input voltage is held in the capacitance, and a difference computation portion that connects, to an end of the capacitance opposite the positive current source, a base voltage portion that generates a predetermined base voltage or a resistive portion connected to a ground voltage;
a cross-bar switch that switches between a case where the reference voltage is output to one output end and the summed voltage is output to another output end, and a case where the reference voltage is output to the other output end and the summed voltage is output to the one output end; and
a comparator that outputs a comparison signal when a voltage at a positive input end exceeds a voltage at a negative input end while the one output end being connected with the negative input end and the other output end being connected with the positive input end, and
wherein the calibration control section comprises:
a unit voltage correlation measurement processing portion that, when a summed voltage resulting from summation with a coarse adjustment positive unit voltage exceeds a sum of the reference voltage and the offset voltage of the comparator, performs summation of the summed voltage with a fine adjustment positive unit voltage, the coarse adjustment positive unit voltage being a unit voltage generated with a positive current having a large absolute value, and the fine adjustment positive unit voltage being of a smaller absolute value than the coarse adjustment positive unit voltage.

6. An AD converter with self-calibration function that does not require an instrument for calibration, the AD converter comprising:
a reference voltage unit that generates a reference voltage;
a summation and conversion unit that has two or more unit voltages serving as units of amount of change in a summed voltage, and during conversion, sums up any one unit voltage of the two or more unit voltages until the summed voltage exceeds a predetermined threshold voltage, with an input voltage being an initial value of the summed voltage; and
a control unit including a calibration control section that calibrates the two or more unit voltages and an offset voltage of a comparator at a time of calibration, and a conversion control section that determines a polarity of the offset voltage of the comparator and thereafter converts the input voltage to a digital value during conversion.

7. The AD converter with self-calibration function according to claim 6, wherein the summation and conversion unit comprises:
a switching section that connects, to a capacitance holding the unit voltage, the input voltage during conversion and either a reference voltage or a ground voltage at the time of calibration;
a summation section that, during conversion, makes the input voltage be held in the capacitance and thereafter sums any one of the two or more unit voltages to the voltage being held to generate a summed voltage, and at a time of calibration, makes the reference voltage or the ground voltage be held in the capacitance and thereafter sums any one of the two or more unit voltages to the voltage being held to generate a summed voltage;
a threshold voltage section that generates the threshold voltage; and
the comparator that outputs a comparison signal when the summed voltage exceeds the threshold voltage while the threshold voltage being connected with a negative input end and the summed voltage being connected with a positive input end.

8. The AD converter with self-calibration function according to claim 2, wherein the calibration control section comprises:
an offset measurement processing portion that measures a summation count of the unit voltage that is required until an output of the comparator is inverted after the capacitance is precharged with a unit voltage equivalent to the reference voltage;
a positive-negative unit voltage correlation measurement processing portion that measures a positive-negative correlation summation count if the input voltage is greater than the reference voltage, the positive-negative correlation summation count being a number of summations that is required until the output of the comparator is inverted as a result of adding a positive unit voltage by an over-summation count equal to the summation count plus a predetermined number of times to generate a summed voltage and thereafter subtracting a negative unit voltage from the summed voltage until the summed voltage becomes smaller than the reference voltage; and
a unit voltage measurement processing portion that measures a unit voltage summation count after the unit voltage is reset, the unit voltage summation count being a number of summations of the unit voltage that is required until the output of the comparator is inverted as a result of summation of the positive unit voltage.

* * * * *